US009391278B2

(12) United States Patent
Iida et al.

(10) Patent No.: US 9,391,278 B2
(45) Date of Patent: Jul. 12, 2016

(54) POLYMER COMPOUND, CHARGE-TRANSPORTING POLYMER, COMPOSITION FOR ORGANIC ELECTROLUMINESCENT ELEMENT, ORGANIC ELECTROLUMINESCENT ELEMENT, ORGANIC EL DISPLAY DEVICE, AND ORGANIC EL LIGHT

(71) Applicant: MITSUBISHI CHEMICAL CORPORATION, Chiyoda-ku (JP)

(72) Inventors: Koichiro Iida, Kanagawa (JP); Tatsushi Baba, Kanagawa (JP); Yanjun Li, Kanagawa (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/575,005

(22) Filed: Dec. 18, 2014

(65) Prior Publication Data

US 2015/0102334 A1 Apr. 16, 2015

Related U.S. Application Data

(63) Continuation of application No. PCT/JP2013/066604, filed on Jun. 17, 2013.

(30) Foreign Application Priority Data

Jun. 18, 2012 (JP) ................. 2012-136946

(51) Int. Cl.
*H01L 51/50* (2006.01)
*H01L 51/00* (2006.01)
*C08G 73/02* (2006.01)
*H01L 51/56* (2006.01)

(52) U.S. Cl.
CPC .......... *H01L 51/0043* (2013.01); *C08G 73/026* (2013.01); *H01L 51/004* (2013.01); *H01L 51/5056* (2013.01); *H01L 51/5088* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2004/0076911 A1 | 4/2004 | So et al. | |
| 2005/0228147 A1 | 10/2005 | So et al. | |
| 2011/0042661 A1* | 2/2011 | Endo ...................... | C08G 61/12 257/40 |
| 2011/0108814 A1 | 5/2011 | Iida et al. | |
| 2011/0127516 A1* | 6/2011 | Nakatani ................. | C07C 25/22 257/40 |
| 2011/0198573 A1 | 8/2011 | Iida et al. | |
| 2012/0256537 A1 | 10/2012 | Nakatani et al. | |
| 2012/0326140 A1 | 12/2012 | Fukushima et al. | |
| 2013/0020562 A1 | 1/2013 | Iida et al. | |
| 2014/0051827 A1 | 2/2014 | Endo et al. | |

FOREIGN PATENT DOCUMENTS

| | | |
|---|---|---|
| CN | 101516960 A | 8/2009 |
| CN | 101536207 A | 9/2009 |
| JP | 2006-503167 | 1/2006 |
| JP | 2012-15539 | 1/2012 |
| JP | 2012-102286 | 5/2012 |
| TW | 201139558 A1 | 11/2011 |
| WO | WO 2004/038505 A1 | 5/2004 |
| WO | WO 2009/102017 A1 | 8/2009 |
| WO | WO 2009/123269 A1 | 10/2009 |
| WO | WO 2010/018813 A1 | 2/2010 |
| WO | WO 2011/078387 A1 | 6/2011 |
| WO | WO 2011/093428 A1 | 8/2011 |
| WO | WO 2011/099531 A1 | 8/2011 |

OTHER PUBLICATIONS

International Search Report issued in International Application No. PCT/JP2013/066604, dated Jul. 16, 2013.
Extended European Search Report issued Mar. 20, 2015 in European Patent Application No. 13807370.5.
Office Action issued Jan. 26, 2016 in Chinese Patent Application No. 201380032365.6 (with English translation).

* cited by examiner

*Primary Examiner* — Gregory Clark
(74) *Attorney, Agent, or Firm* — Oblon, McClelland, Maier & Neustadt, L.L.P.

(57) ABSTRACT

The present invention provides a polymer compound and charge transporting polymer having a high hole injecting and transporting performance, a composition for organic electroluminescent element containing the charge transporting polymer, and an organic electroluminescent element. The polymer compound of the present invention comprises a specific group having a benzocyclobutene ring.

15 Claims, No Drawings

POLYMER COMPOUND, CHARGE-TRANSPORTING POLYMER, COMPOSITION FOR ORGANIC ELECTROLUMINESCENT ELEMENT, ORGANIC ELECTROLUMINESCENT ELEMENT, ORGANIC EL DISPLAY DEVICE, AND ORGANIC EL LIGHT

TECHNICAL FIELD

The present invention relates to a polymer compound, especially a charge-transporting polymer. The invention particularly relates to a charge-transporting polymer useful as a hole injection layer or a hole transport layer of an organic electroluminescent element, a composition for an organic electroluminescent element containing the charge-transporting polymer, and an organic EL display and an organic EL light containing the organic electroluminescent element.

BACKGROUND ART

Methods for forming an organic layer in an organic electroluminescent element include a vacuum deposition method and a wet film-forming method. A vacuum deposition method is advantageous in that lamination is easy, and thus it is easy to improve charge injection from the anode and/or cathode and confine excitons in the light-emitting layer. Meanwhile, a wet film-forming method is advantageous in that no vacuum process is required, it is easy to achieve a large area, and a layer containing several materials with various functions can be easily formed by using a coating liquid prepared by mixing several materials with various functions, for example.

However, according to a wet film-forming method, lamination is difficult. Therefore, as compared with elements obtained using a vacuum deposition method, wet film-forming methods are inferior in terms of driving stability and, except for some instances, have not reached a practical level at present.

Thus, in order to perform lamination by a wet film-forming method, a charge-transporting polymer having a crosslinkable group has been desired and developed. For example, Patent Documents 1 to 4 disclose an organic electroluminescent element containing a specific charge-transporting polymer and laminated by a wet film-forming method.

However, these elements have the problems of high driving voltage, low luminance, and short driving life.

PRIOR ART DOCUMENTS

Patent Documents

Patent Document 1: WO 2009/123269
Patent Document 2: WO 2010/018813
Patent Document 3: WO 2011/078387
Patent Document 4: WO 2011/093428

SUMMARY OF THE INVENTION

Problems That the Invention is to Solve

An object of the invention is to provide a polymer compound having high hole-injecting/transporting ability, a charge-transporting polymer, and a composition for an organic electroluminescent element containing the charge-transporting polymer.

Another object of the invention is to provide an organic electroluminescent element having a low driving voltage, low luminance, and a long driving life.

Means for Solving the Problems

As a result of extensive research, the present inventors have found that the problems mentioned above are solved by using a charge-transporting polymer having a specific crosslinkable group at a specific position, and thus accomplished the invention.

That is, the invention is as follows.

[1] A polymer compound comprising a group represented by the following formula (1) as a side chain connecting to a carbon atom:

[Chemical Formula 1]

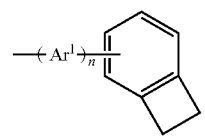

(1)

wherein
the benzocyclobutene ring is optionally substituted, and the substituents may connect to each other to form a ring,
$Ar^1$ represents an optionally substituted aromatic hydrocarbon group or an optionally substituted aromatic heterocyclic group,
n represents an integer of 1 to 6, and
n $Ar^1$s may be the same or different.

[2] The polymer compound according to the [1], wherein the carbon atom to which the group represented by formula (1) connects is a carbon atom that is the center of $sp^3$ hybrid orbitals.

[3] The polymer compound according to the [1] or [2], comprising a nitrogen atom that is the center of $sp^3$ hybrid orbitals in the main chain.

[4] The polymer compound according to any one of the [1] to [3], comprising a monovalent, or divalent or higher group derived from a fluorene ring as a substructure.

[5] The polymer compound according to any one of the [1] to [4], having a weight average molecular weight (Mw) of 20,000 or more and a dispersition (Mw/Mn) of 2.5 or less, wherein Mn represents a number average molecular weight.

[6] The polymer compound according to the [5], having a weight average molecular weight (Mw) of 60,000 or more and a dispersition (Mw/Mn) of 2.0 or less.

[7] The polymer compound according to any one of the [1] to [6], comprising a repeating unit represented by the following formula (2):

[Chemical Formula 2]

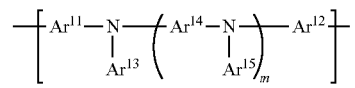

(2)

wherein
    m represents an integer of 0 to 3,
    $Ar^{11}$ and $Ar^{12}$ each independently represent a direct bond, an optionally substituted aromatic hydrocarbon group, or an optionally substituted aromatic heterocyclic group,
    $Ar^{13}$ to $Ar^{15}$ each independently represent an optionally substituted aromatic hydrocarbon group or an optionally substituted aromatic heterocyclic group, and
    m $Ar^{14}$s or m $Ar^{15}$s may each be the same or different, with the proviso that $Ar^{11}$ and $Ar^{12}$ are not direct bonds at the same time.
[8] The polymer compound according to any one of the [1] to [7], comprising a repeating unit represented by the following formula (3):

[Chemical Formula 3]

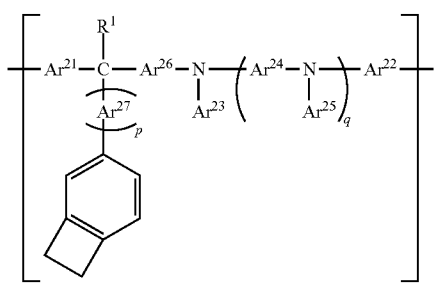

(3)

wherein
    p represents an integer of 1 to 6, q represents an integer of 0 to 3,
    $Ar^{21}$ and $Ar^{22}$ each independently represent a direct bond, an optionally substituted aromatic hydrocarbon group, or an optionally substituted aromatic heterocyclic group,
    $Ar^{23}$ to $Ar^{27}$ each independently represent an optionally substituted aromatic hydrocarbon group or an optionally substituted aromatic heterocyclic group,
    $R^1$ represents a hydrogen atom, an optionally substituted alkyl group having 1 to 24 carbon atoms, an optionally substituted alkoxy group having 1 to 24 carbon atoms, an optionally substituted aromatic hydrocarbon group, or an optionally substituted aromatic heterocyclic group,
    p $Ar^{27}$s may be the same or different, and
    q $Ar^{14}$s or q $Ar^{25}$s may each be the same or different,
    with the proviso that $Ar^{21}$ and $Ar^{22}$ are not direct bonds at the same time.
[9] The polymer compound according to any one of the [1] to [8], wherein the number of groups represented by formula (1) is 0.01 or more and 3 or less per 1,000 of the molecular weight.
[10] A charge-transporting polymer comprising the polymer compound of any one of the [1] to [9],
    the polymer compound having charge-transporting properties.
[11] A composition for an organic electroluminescent element, comprising the charge-transporting polymer of the [10].
[12] An organic electroluminescent element comprising, on a substrate, an anode, a cathode, and an organic layer between the anode and the cathode,
    the organic layer including a layer formed by a wet film-forming method using the composition for an organic electroluminescent element of the [11].
[13] The organic electroluminescent element according to the [12], wherein the layer formed by a wet film-forming method is at least one of an hole injection layer and a hole transport layer.
[14] The organic electroluminescent element according to the [12] or [13], comprising an hole injection layer, a hole transport layer, and a light-emitting layer between the anode and the cathode,
    the hole injection layer, the hole transport layer, and the light-emitting layer all being formed by a wet film-forming method.
[15] An organic EL display device comprising the organic electroluminescent element of any one of the [12] to [14].
[16] An organic EL light comprising the organic electroluminescent element of any one of the [12] to [14].

Advantage of the Invention

The polymer compound of the invention prevents trapping caused by crosslinking groups, has high hole-transporting ability, has excellent solubility in an organic solvent, has excellent film-forming properties and electrochemical stability, can be made poorly soluble in an organic solvent with a small number of crosslinking groups, and does not require a crosslinking reaction initiator for the crosslinking reaction.

In addition, using the polymer compound of the invention as a charge-transporting polymer, when a film is formed by a wet process using a composition for an organic electroluminescent element containing the polymer, and then the charge-transporting polymer is crosslinked, the resulting layer (crosslinked layer) is poorly soluble in an organic solvent, and a flat layer is obtained without cracking, etc.

An organic electroluminescent element having the crosslinked layer according to the invention has a low driving voltage and a long driving life.

In addition, the polymer compound of the invention has excellent electrochemical stability. Therefore, an element containing a layer formed using the polymer compound can be applied to flat panel displays (e.g., for OA computers, wall televisions), in-vehicle display devices, mobile phone displays, light sources taking advantage of the characteristics as an area emitter (e.g., light sources for copying machines, back-light sources for liquid crystal displays and instruments), display boards, and sign lamps. The technical value thereof is thus high.

Mode for Carrying Out the Invention

Hereinafter, embodiments of the invention will be described in detail. However, the description of constituent elements given below show examples (typical examples) of the embodiments of the invention, and, within the gist thereof, the invention is not limited thereto.

The polymer compound of the invention is suitable for use as a charge-transporting polymer. Hereinafter, embodiments of a charge-transporting polymer and an organic electroluminescent element using the polymer will be described in detail.

<Charge-Transporting Polymer>

The charge-transporting polymer of the invention is a charge-transporting polymer characterized by having a group represented by the following formula (1) as a side chain connecting to a carbon atom.

[Chemical Formula 4]

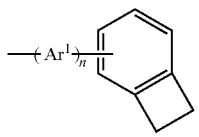

(1)

(The benzocyclobutene ring in formula (1) is optionally substituted, and the substituents may connect to each other to form a ring. $Ar^1$ represents an optionally substituted aromatic hydrocarbon group or an optionally substituted aromatic heterocyclic group, and n represents an integer of 1 or more and 6 or less. n $Ar^1$s may be the same or different.)

The charge-transporting polymer of the invention has a benzocyclobutene ring connecting to a carbon atom in the main chain via one to six aromatic hydrocarbon groups or aromatic heterocyclic groups.

The charge-transporting polymer of the invention has one to six aromatic hydrocarbon groups or aromatic heterocyclic groups between the main chain and the crosslinking group. As a result, there is a moderate distance between main chains, preventing aggregation, etc. Further, charge transfer between the crosslinked main chains is also promoted. In addition, the polymer has a rigid structure between the main chain and the crosslinking group, and thus also has excellent heat resistance.

It is preferable that in the charge-transporting polymer of the invention, a carbon atom in the main chain, which is the center of $sp^3$ hybrid orbitals, has a benzocyclobutene ring via one to six aromatic hydrocarbon groups or aromatic heterocyclic groups.

A carbon atom that is the center of $sp^3$ hybrid orbitals is not involved in a π-conjugated system. Thus, the crosslinking group that is a side chain connecting to the carbon atom that is the center of $sp^3$ hybrid orbitals is unlikely to hinder charge transport. Accordingly, the charge-transporting polymer and a network polymer obtained by crosslinking the charge-transporting polymer have improved charge-transporting properties.

Further, as compared with an atom at the center of $sp^2$ hybrid orbitals, bonds around an atom at the center of $sp^3$ hybrid orbitals in the polymer main chain are prone to rotation. Therefore, crosslinking groups in the charge-transporting polymer react efficiently. Accordingly, even when the number of crosslinking groups is small or the crosslinking reaction conditions are mild, the polymer can be made poorly soluble in an organic solvent.

[1. Group Represented by Formula (1)]

Examples of substituents optionally present on the benzocyclobutene ring in formula (1) in addition to $Ar^1$ include those given in the section [Substituent Group Z] below. In addition, in terms of the steric hindrance of substituents, and because the crosslinking reaction is not much affected by the electronic effects of substituents, it is preferable that benzocyclobutene ring in formula (1) has no substituents other than $Ar^1$.

[1-1. $Ar^1$]

$Ar^1$ represents an optionally substituted aromatic hydrocarbon group or an optionally substituted aromatic heterocyclic group.

Examples of aromatic hydrocarbon groups include 6-membered monocyclic or 2- to 5-fused ring monovalent or higher-valent groups such as a benzene ring, a naphthalene ring, an anthracene ring, a phenanthrene ring, a perylene ring, a tetracene ring, a pyrene ring, a benzpyrene ring, a chrysene ring, a triphenylene ring, an acenaphthene ring, a fluoranthene ring, and a fluorene ring.

Examples of aromatic heterocyclic groups include 5- or 6-membered monocyclic or 2- to 4-fused ring monovalent or higher-valent groups such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, and an azulene ring.

In terms of having excellent charge-transporting properties and excellent durability, it is preferable that $Ar^1$ is a group derived from a ring selected from the group consisting of a benzene ring, a naphthalene ring, an anthracene ring, and a phenanthrene ring. A group derived from a benzene ring, that is, a phenylene group, is the most preferable.

Substituents optionally present on the aromatic hydrocarbon group and the aromatic heterocyclic group are not particularly limited and may be groups selected from the Substituent Group Z below, for example. An alkyl group, an alkoxy group, an aromatic hydrocarbon group, and an aromatic heterocyclic group are preferable.

In terms of having excellent charge-transporting properties and excellent durability, the number of carbon atoms in $Ar^1$ including substituents is usually 3 or more, preferably 5 or more, still more preferably 6 or more, and usually 36 or less, preferably 24 or less, still more preferably 12 or less.

[Substituent Group Z]

The group includes:

linear, branched, and cyclic alkyl groups having usually 1 or more and usually 24 or less, preferably 12 or less, carbon atoms, such as a methyl group, an ethyl group, an n-propyl group, an i-propyl group, an n-butyl group, an i-butyl group, a sec-butyl group, a tert-butyl group, an n-hexyl group, a cyclohexyl group, and a dodecyl group;

alkenyl groups having usually 2 or more and usually 24 or less, preferably 12 or less, carbon atoms, such as a vinyl group;

alkynyl groups having usually 2 or more and usually 24 or less, preferably 12 or less, carbon atoms, such as an ethynyl group;

alkoxy groups having usually 1 or more and usually 24 or less, preferably 12 or less, carbon atoms, such as a methoxy group and an ethoxy group;

aryloxy groups having usually 4 or more, preferably 5 or more, and usually 36 or less, preferably 24 or less, carbon atoms, such as a phenoxy group, a naphthoxy group, and a pyridyloxy group;

alkoxycarbonyl groups having usually 2 or more and usually 24 or less, preferably 12 or less, carbon atoms, such as a methoxycarbonyl group and an ethoxycarbonyl group;

dialkylamino groups having usually 2 or more and usually 24 or less, preferably 12 or less, carbon atoms, such as a dimethylamino group and a diethylamino group;

diarylamino groups having usually 10 or more, preferably 12 or more, and usually 36 or less, preferably 24 or less, carbon atoms, such as a diphenylamino group, a ditolylamino group, and an N-carbazolyl group;

arylalkylamino groups having usually 7 or more and usually 36 or less, preferably 24 or less, carbon atoms, such as a phenylmethylamino group;

acyl groups having usually 2 or more and usually 24 or less, preferably 12 or less, carbon atoms, such as an acetyl group and a benzoyl group;

halogen atoms such as a fluorine atom and a chlorine atom;

haloalkyl groups having usually 1 or more and usually 12 or less, preferably 6 or less, carbon atoms, such as a trifluoromethyl group;

alkylthio groups having usually 1 or more and usually 24 or less, preferably 12 or less, carbon atoms, such as a methylthio group and an ethyl thio group;

arylthio groups having usually 4 or more, preferably 5 or more, and usually 36 or less, preferably 24 or less, carbon atoms, such as a phenylthio group, a naphthylthio group, and a pyridylthio group;

silyl groups having usually 2 or more, preferably 3 or more, and usually 36 or less, preferably 24 or less, carbon atoms, such as a trimethylsilyl group and a triphenylsilyl group;

siloxy groups having usually 2 or more, preferably 3 or more, and usually 36 or less, preferably 24 or less, carbon atoms, such as a trimethylsiloxy group and a triphenylsiloxy group;

a cyano group;

aromatic hydrocarbon groups having usually 6 or more and usually 36 or less, preferably 24 or less, carbon atoms, such as a phenyl group and a naphthyl group; and aromatic heterocyclic groups having usually 3 or more, preferably 4 or more, and usually 36 or less, preferably 24 or less, carbon atoms, such as a thienyl group and a pyridyl group.

Among these substituents, in terms of solubility, $C_{1-12}$ alkyl groups and $C_{1-12}$ alkoxy groups are preferable.

In addition, the substituents may each further bear a substituent, and such substituents may be selected from the groups given in the section of Substituent Group Z, for example.

[1-2. n]

n represents an integer of 1 or more and 6 or less. In order to promote the crosslinking reaction and also provide excellent charge-transporting properties without the aggregation or too much separation of main chains after the crosslinking reaction, it is preferable that n is an integer of 1 or more and 3 or less. In addition, n $Ar^1$s may be the same or different.

[2. Preferred Substructure]

In terms of having excellent charge-transporting properties, it is preferable that the charge-transporting polymer of the invention has an amine structure in the main chain, that is, has a nitrogen atom that is the center of $sp^a$ hybrid orbitals in the main chain.

In addition, in terms of having excellent charge-transporting properties and also having excellent solubility before the crosslinking reaction, it is preferable that the charge-transporting polymer of the invention has a monovalent, divalent, or higher-valent group derived from a fluorene ring as a substructure.

[3. Preferred Molecular Weight Distribution]

In terms of having excellent charge-transporting properties and also of the ease of becoming poorly soluble in an organic solvent after the crosslinking reaction, it is preferable that the charge-transporting polymer of the invention has a weight average molecular weight (Mw) of 20,000 or more, and still more preferably 60,000 or more.

In terms of having excellent charge-transporting properties and also of the ease of becoming poorly soluble in an organic solvent after the crosslinking reaction, it is preferable that the charge-transporting polymer of the invention has a dispersion (Mw/Mn) of 2.5 or less, and still more preferably 2.0 or less.

The weight average molecular weight (Mw) and dispersion (Mw/Mn) are determined by SEC (size exclusion chromatography) measurement. In SEC measurement, a higher-molecular-weight component results in a shorter elution time, and a lower-molecular-weight component results in a longer elution time. Using a calibration curve calculated from the elution time of a polystyrene with a known molecular weight (reference sample), the elution time of a sample is converted into a molecular weight to calculate the weight average molecular weight.

[4. Repeating Unit Represented by Formula (2)]

In terms of having excellent charge-transporting properties and excellent electrical durability, it is preferable that the charge-transporting polymer of the invention contains a repeating unit represented by the following formula (2).

[Chemical Formula 5]

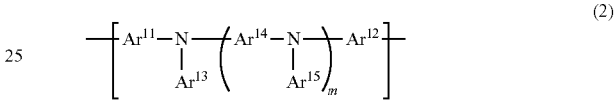

(2)

(In the formula, m represents an integer of 0 or more and 3 or less, $Ar^{11}$ and $Ar^{12}$ each independently represent a direct bond, an optionally substituted aromatic hydrocarbon group, or an optionally substituted aromatic heterocyclic group, and $Ar^{13}$ to $Ar^{15}$ each independently represent an optionally substituted aromatic hydrocarbon group or an optionally substituted aromatic heterocyclic group. m $Ar^{14}$s and m $Ar^{15}$s may each be the same or different. However, $Ar^{11}$ and $Ar^{12}$ are not direct bonds at the same time.)

[4-1. $Ar^{11}$ to $Ar^{15}$]

In formula (2), $Ar^{11}$ and $Ar^{12}$ each independently represent a direct bond, an optionally substituted aromatic hydrocarbon group, or an optionally substituted aromatic heterocyclic group, and $Ar^{13}$ to $Ar^{15}$ each independently represent an optionally substituted aromatic hydrocarbon group or an optionally substituted aromatic heterocyclic group.

Examples of optionally substituted aromatic hydrocarbon groups include groups derived from a 6-membered monocyclic or 2- to 5-fused ring, such as a benzene ring, a naphthalene ring, an anthracene ring, a phenanthrene ring, a perylene ring, a tetracene ring, a pyrene ring, a benzpyrene ring, a chrysene ring, a triphenylene ring, an acenaphthene ring, a fluoranthene ring, and a fluorene ring.

Examples of optionally substituted aromatic heterocyclic groups include groups derived from a 5- or 6-membered monocyclic or 2- to 4-fused ring, such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, and an azulene ring.

In terms of solubility in a solvent and heat resistance, it is preferable that $Ar^{11}$ to $Ar^{15}$ are each independently a group derived from a ring selected from the group consisting of a benzene ring, a naphthalene ring, an anthracene ring, a phenanthrene ring, a triphenylene ring, a pyrene ring, a thiophene ring, a pyridine ring, and a fluorene ring.

In addition, as $Ar^{11}$ to $Ar^{15}$, groups having one or more rings selected from the above group connected thereto via a direct bond are also preferable. A biphenyl group, a biphenylene group, a terphenyl group, and a terphenylene group are still more preferable.

Substituents optionally present on the optionally substituted aromatic hydrocarbon group and the optionally substituted aromatic heterocyclic group may be the groups given in [Substituent Group Z] above.

In terms of having excellent charge-transporting properties, the number of carbon atoms in $Ar^{11}$ to $Ar^{15}$ including substituents is usually 3 or more, preferably 5 or more, still more preferably 6 or more, and usually 72 or less, preferably 48 or less, still more preferably 25 or less.

[4-2. m]

m in formula (2) represents an integer of 0 or more and 3 or less.

In order to enhance the solubility in an organic solvent and film-forming properties of the crosslinkable polymer, it is preferable that m is 0. In addition, in order to improve the hole-transporting ability of the polymer, it is preferable that m is 1 or more and 3 or less.

Incidentally, in the case where m is 2 or more, the repeating unit represented by the above formula (2) has two or more $Ar^{14}$s and two or more $Ar^{15}$s. In that case, the $Ar^{14}$s and the $Ar^{15}$s may each be the same or different. Further, the $Ar^{14}$s and the $Ar^{15}$s may each connect to each other directly or via a linking group to form a cyclic structure.

[5. Repeating Unit Represented by Formula (3)]

In terms of having excellent charge-transporting properties and excellent electrical durability, it is preferable that the charge-transporting polymer of the invention contains a repeating unit represented by the following formula (3).

[Chemical Formula 6]

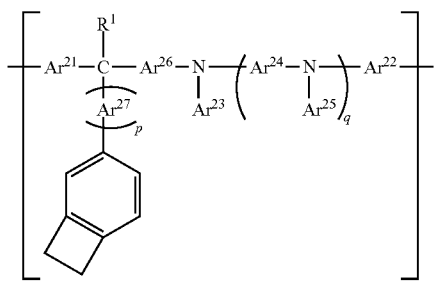

(3)

(In the formula, p represents an integer of 1 or more and 6 or less, q represents an integer of 0 or more and 3 or less, $Ar^{21}$ and $Ar^{22}$ each independently represent a direct bond, an optionally substituted aromatic hydrocarbon group, or an optionally substituted aromatic heterocyclic group, and $Ar^{23}$ to $Ar^{27}$ each independently represent an optionally substituted aromatic hydrocarbon group or an optionally substituted aromatic heterocyclic group.

$R^1$ represents a hydrogen atom, an optionally substituted alkyl group having 1 to 24 carbon atoms, an optionally substituted alkoxy group having 1 to 24 carbon atoms, an optionally substituted aromatic hydrocarbon group, or an optionally substituted aromatic heterocyclic group.

p $Ar^{27}$s may be the same or different. q $Ar^{24}$s and q $Ar^{25}$s may each be the same or different. However, $Ar^{21}$ and $Ar^{22}$ are not direct bonds at the same time.)

[5-1. $Ar^{21}$ to $Ar^{26}$ and q]

In formula (3), $Ar^{21}$ and $Ar^{22}$ each independently represent a direct bond, an optionally substituted aromatic hydrocarbon group, or an optionally substituted aromatic heterocyclic group, and $Ar^{21}$ and $Ar^{22}$ are not direct bonds at the same time.

$Ar^{23}$ to $Ar^{26}$ each independently represent an optionally substituted aromatic hydrocarbon group or an optionally substituted aromatic heterocyclic group.

Specific examples and preferred examples of $Ar^{21}$ to $Ar^{26}$ are the same as those of $Ar^{11}$ to $Ar^{15}$ mentioned above.

q in formula (3) represents an integer of 0 or more and 3 or less. In order to enhance the solubility in an organic solvent and film-forming properties of the crosslinkable polymer, it is preferable that q is 0. In addition, in order to improve the hole-transporting ability of the polymer, it is preferable that q is 1 or more and 3 or less.

Incidentally, in the case where q is 2 or more, the repeating unit represented by the above formula (3) has two or more $Ar^{24}$s and two or more $Ar^{25}$s. In that case, the $Ar^{24}$s and the $Ar^{25}$s may each be the same or different. Further, the $Ar^{24}$s and the $Ar^{25}$s may each connect to each other directly or via a linking group to form a cyclic structure.

[5-2. $Ar^{27}$ and p]

$(Ar^{27})_p$ in formula (3) is a group connecting to a carbon atom that is the center of sp³ hybrid orbitals and a benzocyclobutene ring, and is $(Ar^1)_n$ in formula (1). $Ar^{27}$ represents an optionally substituted aromatic hydrocarbon group or an optionally substituted aromatic heterocyclic group, and p represents an integer of 0 or more and 6 or less. p $Ar^{27}$s may be the same or different. Specific examples and preferred examples of $Ar^{27}$ are the same as those of $Ar^1$ mentioned above.

[5-3. $R^1$]

$R^1$ represents a hydrogen atom, an optionally substituted alkyl group having 1 to 24 carbon atoms, an optionally substituted alkoxy group having 1 to 24 carbon atoms, an optionally substituted aromatic hydrocarbon group, or an optionally substituted aromatic heterocyclic group. Among them, in terms of having excellent charge-transporting properties and high solubility before the crosslinking reaction, an alkyl group is preferable.

Preferred examples of alkyl groups include groups having usually 1 or more and usually 24 or less, preferably 12 or less, carbon atoms such as a methyl group, an ethyl group, an n-propyl group, an i-propyl group, an n-butyl group, an i-butyl group, a sec-butyl group, a tert-butyl group, an n-hexyl group, a cyclohexyl group, and a dodecyl group. Preferred examples of alkoxy groups include groups having usually 1 or more and usually 24 or less, preferably 12 or less, carbon atoms, such as a methoxy group and an ethoxy group. Their optional substituents may be groups selected from the Substituent Group Z above. An alkyl group, an alkoxy group, an aromatic hydrocarbon group, and an aromatic heterocyclic group are preferable.

Specific examples and preferred examples of optionally substituted aromatic hydrocarbon groups and optionally substituted aromatic heterocyclic groups are the same as those of $Ar^{11}$ to $Ar^{15}$ mentioned above.

[6. The Number of Groups Represented by Formula (1)]

In the invention, the number of groups represented by formula (1) in the charge-transporting polymer of the invention is expressed as the number per 1,000 of the molecular weight. Here, the number of groups represented by formula (1) per 1,000 of the molecular weight of the charge-transporting polymer can be calculated, excluding the terminal groups of the charge-transporting polymer, from the feed molar ratio of the monomers at the time of synthesis and their structural formulae.

As an example, the case of a charge-transporting polymer (H1) used in Example 1 below will be described. In the charge-transporting polymer (H1), the molecular weight excluding the terminal groups is 589.94, and the number of groups represented by formula (1) is 0.05 per molecule on average. According to simple proportion, the number of groups represented by formula (1) per 1,000 of the molecular weight is calculated to be 0.085. The number of groups represented by formula (1) in the charge-transporting polymer of the invention is usually 3.0 or less, preferably 2.0 or less, still more preferably 1.0 or less, and usually 0.01 or more, preferably 0.05 or more, per 1,000 of the molecular weight.

When the number is more than the upper limit, a flat film may not be obtained due to cracking, or the crosslinking density may become too high, resulting in an increase in the number of unreacted groups represented by formula (1) in the crosslinked layer, affecting the life of the obtained element. Meanwhile, when the number is less than the lower limit, the insolubilization of the crosslinked layer may be insufficient, making it impossible to form a multilayer laminate structure by a wet film-forming method.

[Chemical Formula 7]

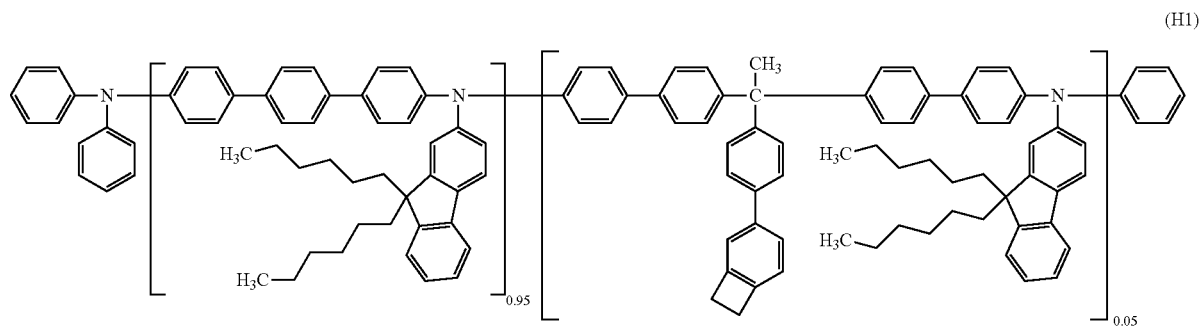

(H1)

[7. Specific Examples]

Hereinafter, preferred examples of repeating units for the charge-transporting polymer of the invention will be shown. However, the invention is not limited thereto.

[Chemical Formula 8]

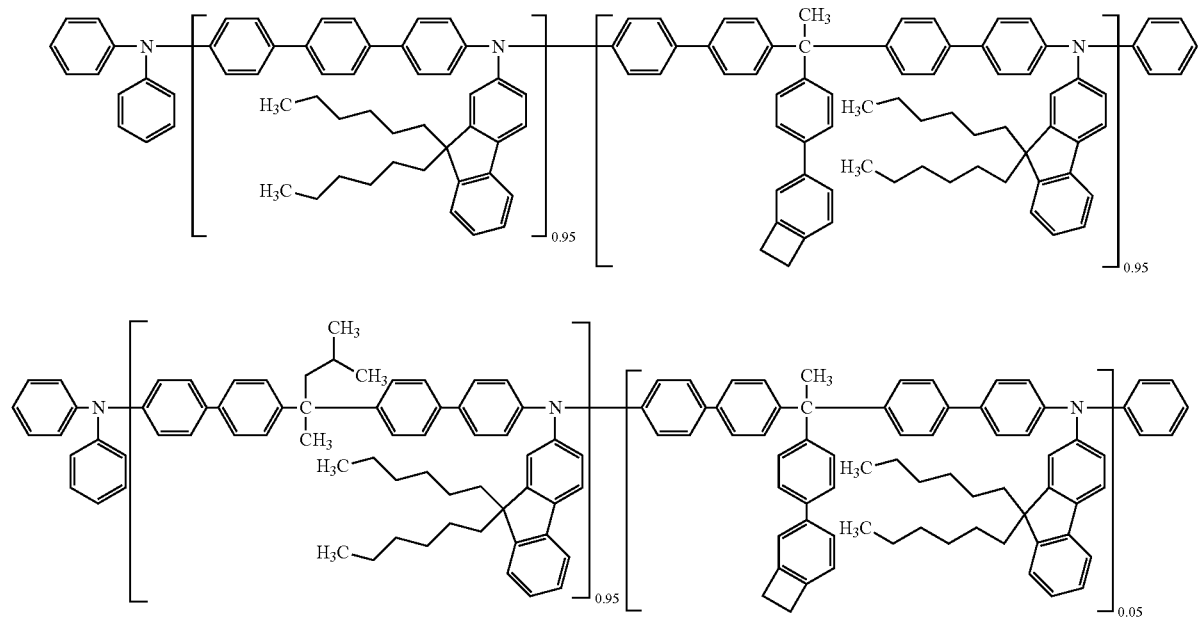

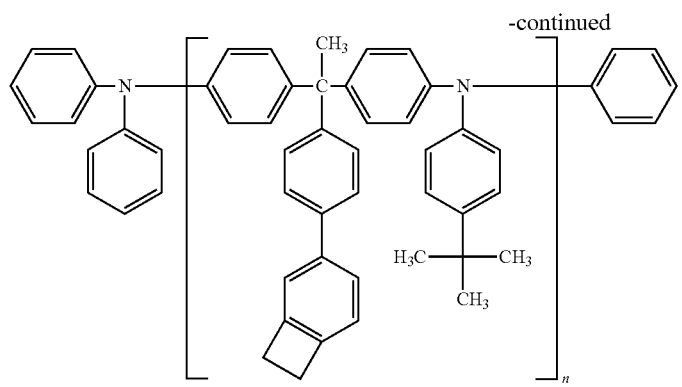
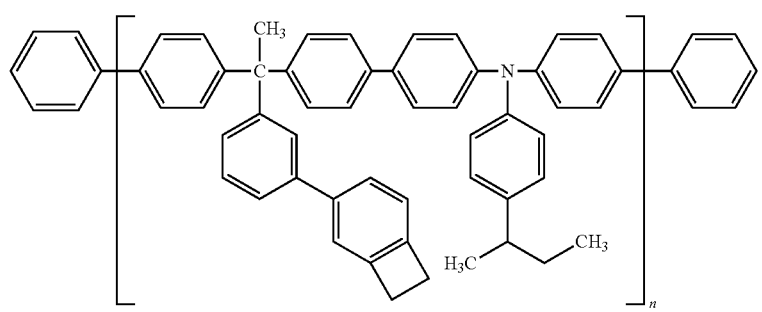
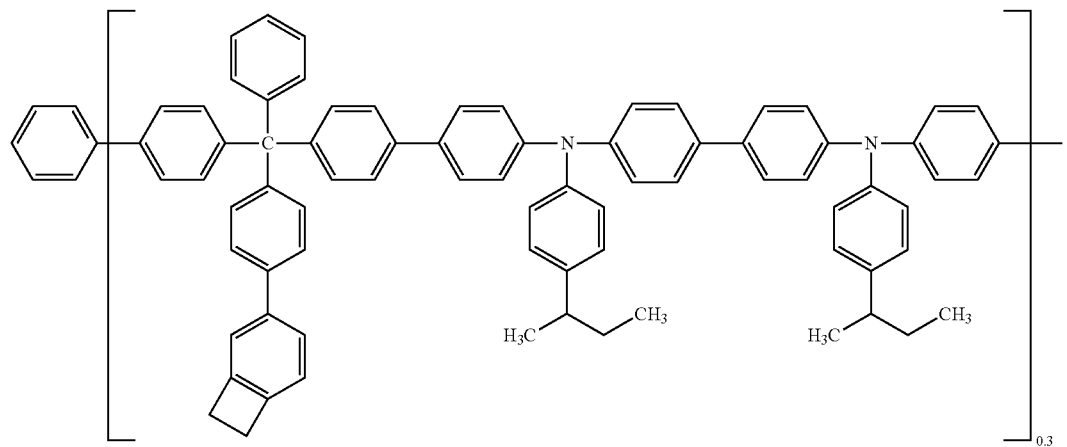
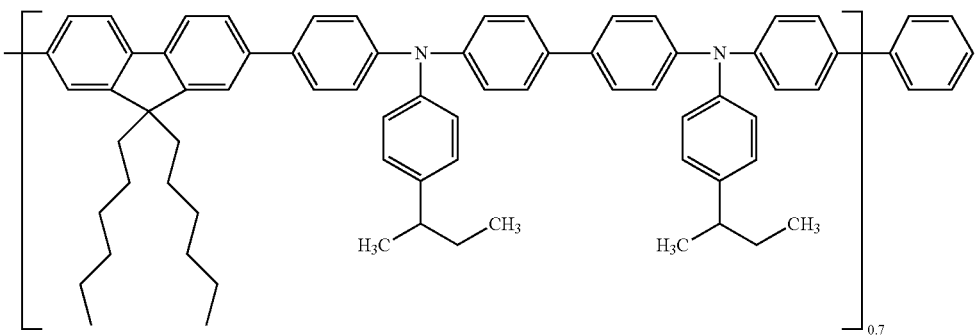

-continued
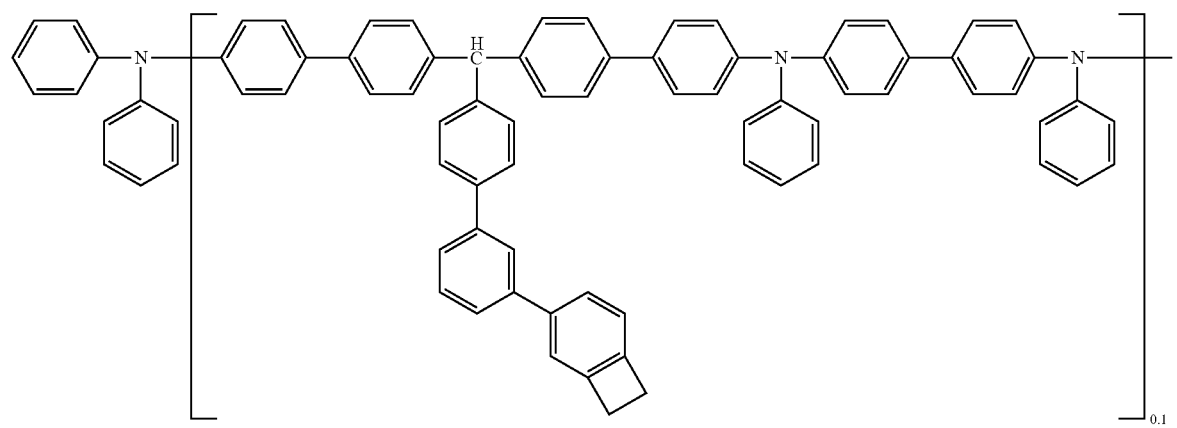
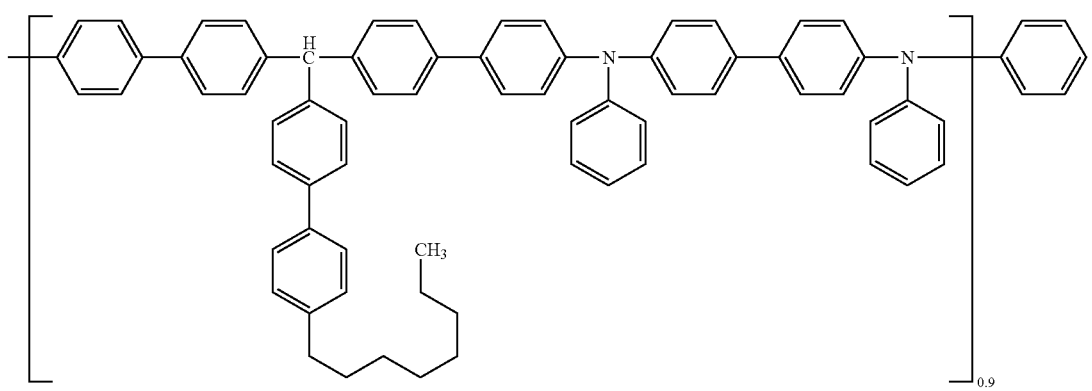
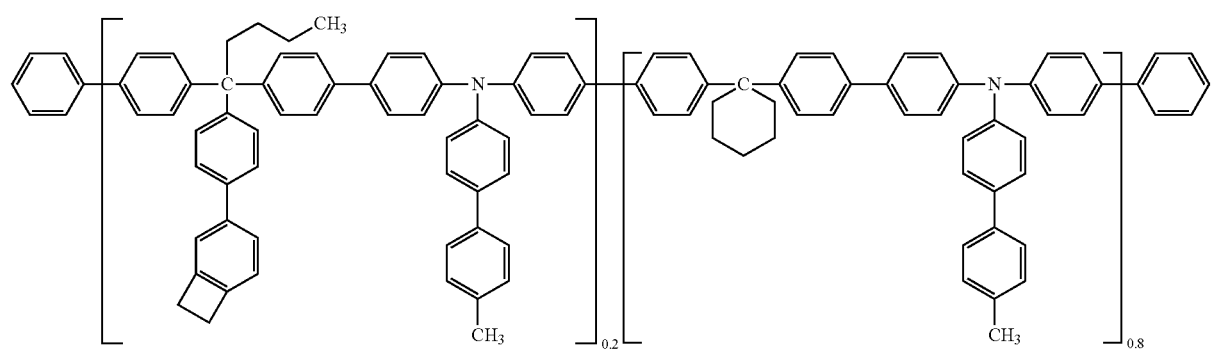
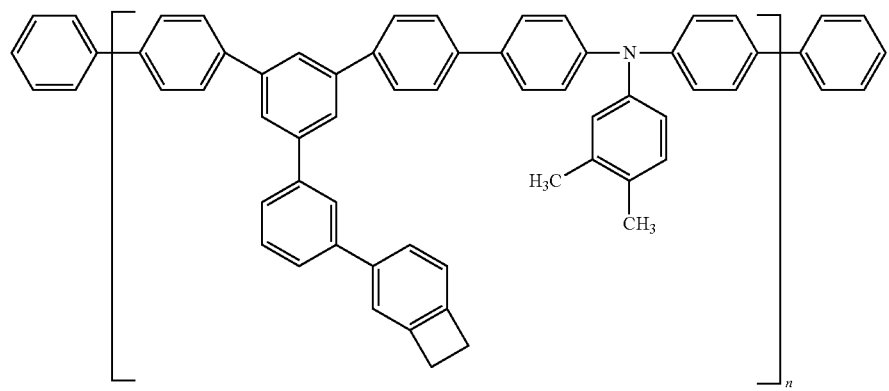

[Chemical Formula 9]
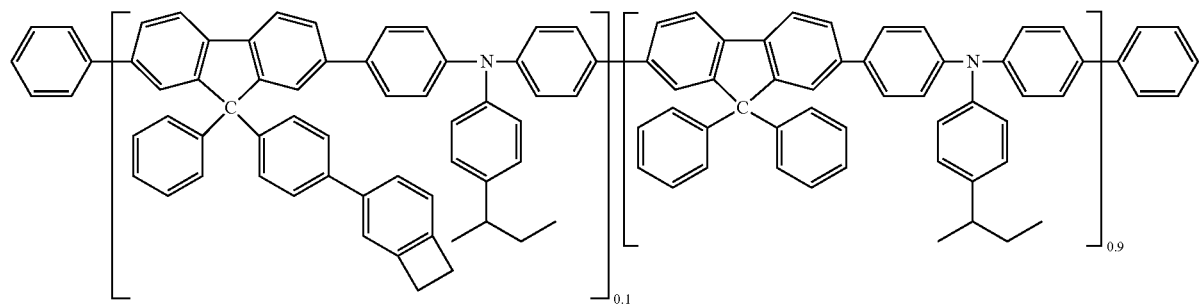
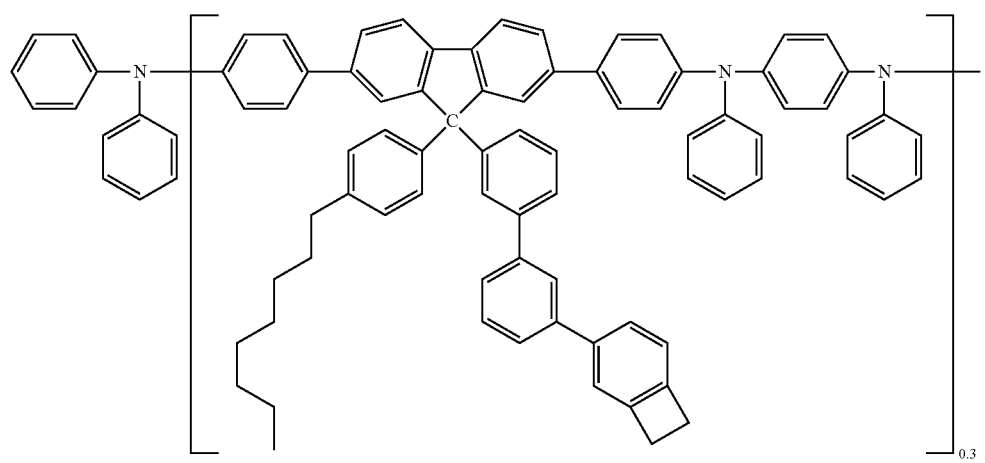
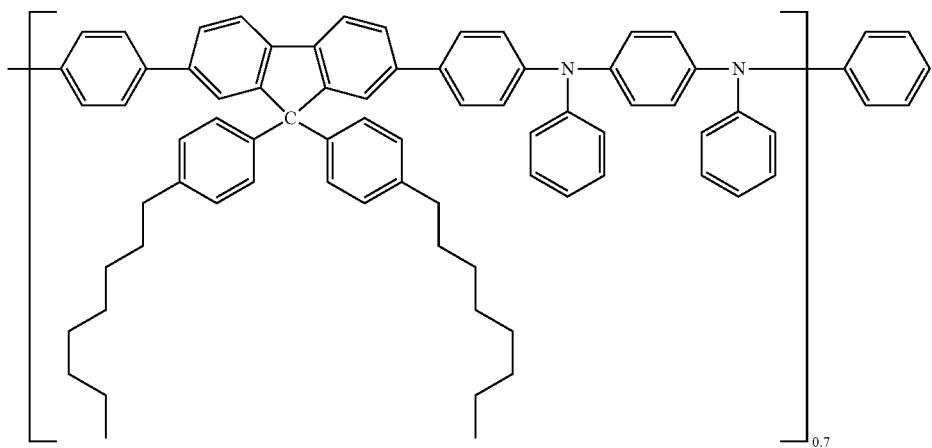

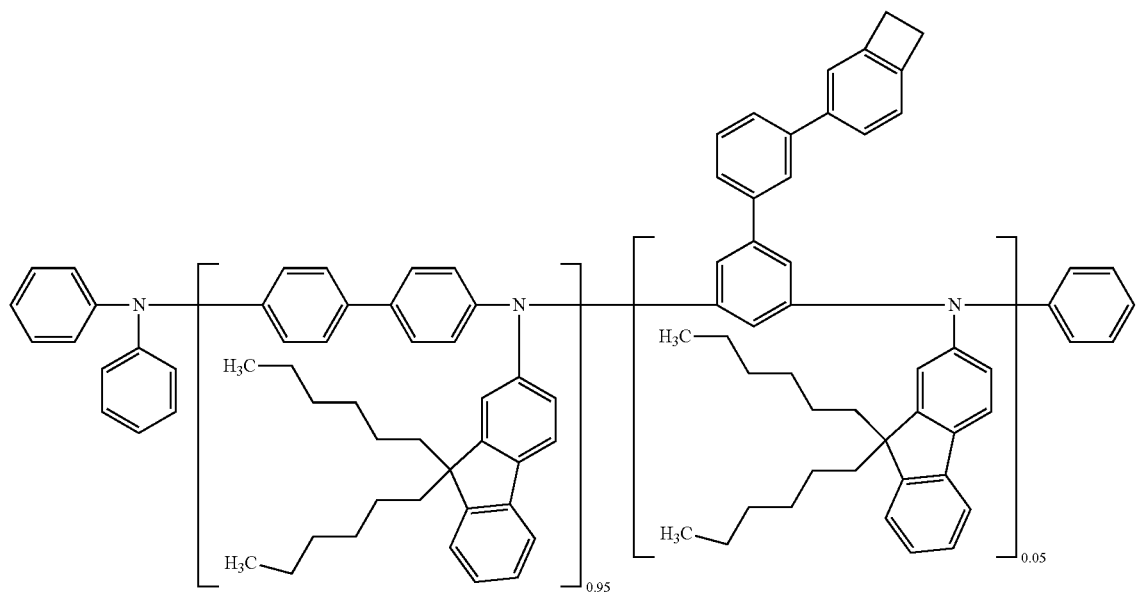

\<Synthesizing Method\>

The charge-transporting polymer of the invention can be synthesized from raw materials selected according to the structure of the desired compound using a known technique.

As a synthesizing method for a monomer having a group represented by formula (1), a known coupling technique can be applied. For example, synthesis is performed by Suzuki reaction as in the following formula.

[Chemical Formula 11]

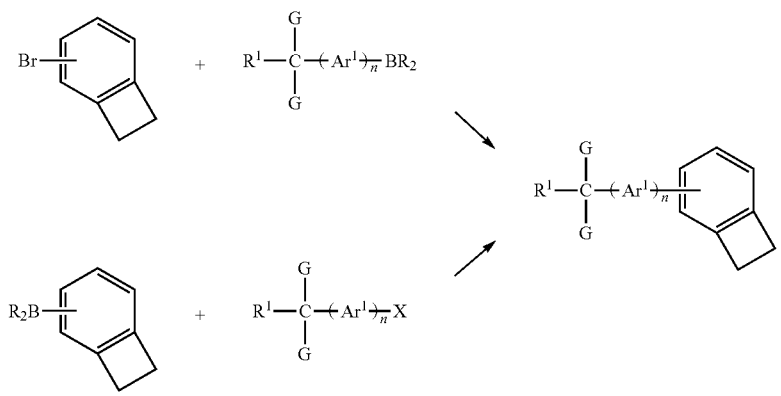

(In the formula, G represents a group that reacts upon polymerization, and $BR_2$ represents a boronic acid group or a boronic acid ester group. $R^1$ represents a hydrogen atom, an optionally substituted alkyl group having 1 to 24 carbon atoms, an optionally substituted alkoxy group having 1 to 24 carbon atoms, an optionally substituted aromatic hydrocarbon group, or an optionally substituted aromatic heterocyclic group. $Ar^1$ represents an optionally substituted aromatic hydrocarbon group or an optionally substituted aromatic heterocyclic group, and n represents an integer of 1 to 6. n $Ar^1$s may be the same or different.)

The method for producing the polymer of the invention is not particularly limited and may be any method as long as the polymer of the invention is obtained. For example, it can be produced by a polymerization method using Suzuki reaction, a polymerization method using Grignard reaction, a polymerization method using Yamamoto reaction, a polymerization method using Ullmann reaction, a polymerization method using Buchwald-Hartwig reaction, etc.

In the case of a polymerization method using Ullmann reaction and a polymerization method using Buchwald-Hartwig reaction, for example, dihalogenated aryls represented by formulae (1a) and (2a) (X represents a halogen atom such as I, Br, Cl, or F) are allowed to react with a primary aminoaryl or secondary diaminoaryl represented by formula (3a) to synthesize the polymer of the invention.

[Chemical Formula 11]

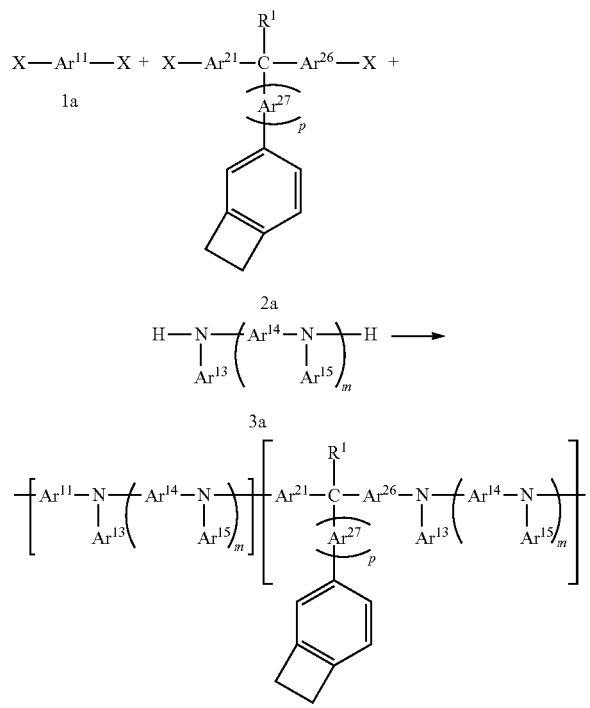

(In the above formulae, X represents a halogen atom. m represents an integer of 0 to 3, and p represents an integer of 1 to 6. $Ar^{11}$ represents a direct bond, an optionally substituted aromatic hydrocarbon group, or an optionally substituted aromatic heterocyclic group, $Ar^{13}$ to $Ar^{15}$ each independently represent an optionally substituted aromatic hydrocarbon group or an optionally substituted aromatic heterocyclic group. $Ar^{21}$ represents a direct bond, an optionally substituted aromatic hydrocarbon group, or an optionally substituted aromatic heterocyclic group, and $Ar^{26}$ and $Ar^{27}$ each independently represent an optionally substituted aromatic hydrocarbon group or an optionally substituted aromatic heterocyclic group. $R^1$ represents a hydrogen atom, an optionally substituted alkyl group having 1 to 24 carbon atoms, an optionally substituted alkoxy group having 1 to 24 carbon atoms, an optionally substituted aromatic hydrocarbon group, or an optionally substituted aromatic heterocyclic group. p $Ar^{27}$s may be the same or different. m $Ar^{14}$s and m $Ar^{15}$s may each be the same or different.)

Incidentally, in the above polymerization method, the reaction to form an N-aryl bond is usually carried out in the presence of a base such as potassium carbonate, sodium tert-butoxide, or triethylamine, for example. The reaction may also be carried out in the presence of a transition metal catalyst such as copper, nickel, or palladium, for example. Preferred examples of transition metal catalysts to be used include palladium compounds and phosphine ligands. Preferred examples of palladium compounds include palladium chloride, palladium acetate, bis(dibenzylideneacetone)palladium, and a tris(dibenzylideneacetone)dipalladium chloroform complex. Preferred examples of phosphine ligands include tri-tert-butylphosphine, tricyclohexylphosphine, di-tert-butylphenylphosphine, di-tert-butyl(4-dimethylaminophenyl)phosphine, and 2-dicyclohexylphosphino-2',6'-dimethoxybiphenyl.

In the case of a polymerization method using Suzuki reaction, for example, boron derivatives represented by formulae (1b) and (2b) ($BR_2$ represents a boronic acid group or a boronic acid ester group) are allowed to react with a dihalogenated aryl represented by formula (2c) (X represents a halogen atom such as I, Br, Cl, or F) to synthesize the polymer of the invention.

[Chemical Formula 12]

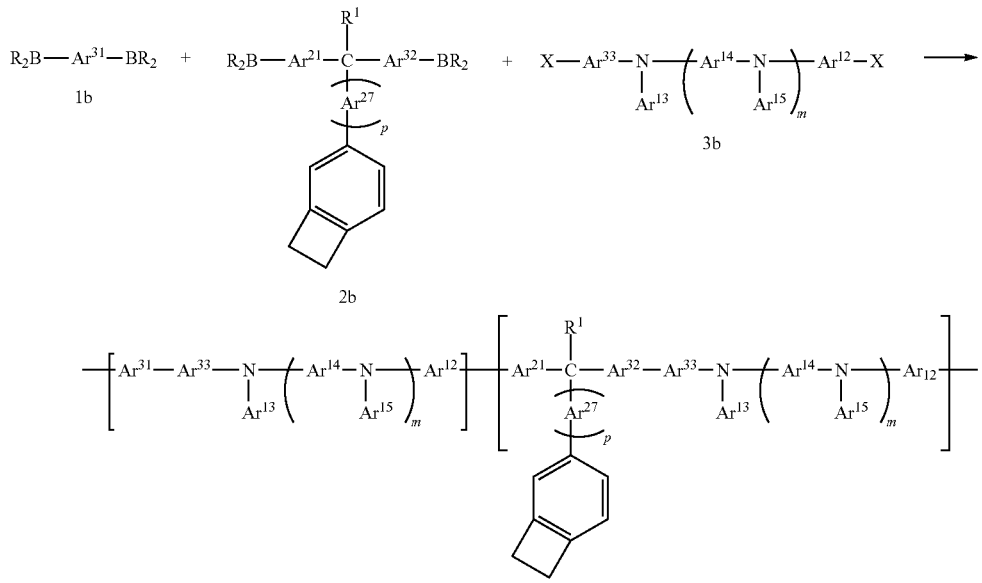

(In the above formulae, $BR_2$ represents a boronic acid group or a boronic acid ester group, and X represents a halogen atom. m represents an integer of 0 to 3, and p represents an integer of 1 to 6. $Ar^{12}$ to $Ar^{15}$ each independently represent an optionally substituted aromatic hydrocarbon group or an optionally substituted aromatic heterocyclic group, $Ar^{21}$, $Ar^{27}$, and $Ar^{31}$ to $Ar^{33}$ each independently represent an optionally substituted aromatic hydrocarbon group or an optionally substituted aromatic heterocyclic group. $R^1$ represents a hydrogen atom, an optionally substituted alkyl group, an optionally substituted alkoxy group, an optionally substituted aromatic hydrocarbon group, or an optionally substituted aromatic heterocyclic group. p $Ar^{27}$s may be the same or different. m $Ar^{14}$s and m $Ar^{15}$s may each be the same or different.)

Incidentally, in the above polymerization method, the step of allowing boron derivatives to react with a dihalogenated product is usually carried out in the presence of a base such as potassium carbonate, sodium tert-butoxide, or triethylamine, for example. As necessary, the reaction may also be carried in the presence of a transition metal catalyst such as copper or a palladium complex, for example. Further, in the step of allowing boron derivatives to react, the reaction can be carried out in the presence of a base, such as potassium carbonate, potassium phosphate, sodium tert-butoxide, or triethylamine, and a transition metal catalyst, such as a palladium complex, for example.

For the charge-transporting polymer of the invention, in addition to the polymerization methods mentioned above, it is also possible to use the polymerization method described in JP-A-2001-223084, the polymerization method described in JP-A-2003-213002, and the polymerization method described in JP-A-2004-2740, as well as the radical polymerization of a compound having an unsaturated double bond, successive polymerization by a reaction that forms an ester bond or an amide bond, etc.

In addition, known coupling reactions may be used. As a known coupling technique, specifically, it is possible to use a linking (coupling) reaction between rings, such as the coupling reaction between an aryl halide and an aryl borate described or cited in "Palladium in Heterocyclic Chemistry: A guide for the Synthetic Chemist" (Second Edition, 2002, Jie Jack Li and Gordon W. Gribble, Pergamon), "*Seni-Kinzoku ga Hiraku Yuki-Gosei, Sono Tasai na Hanno-Keishiki to Saishin no Seika* (Organic Synthesis Developed by Transition Metals: Their Various Reaction Forms and the Newest Results)" (1997, Jiro Tsuji, Kagakudojin), "*Boruharuto-Shoa, Gendai Yuki-Kagaku, Ge* (Vollhardt-Schore, Modern Organic Chemistry, the Last Volume" (2004, K. P. C. Vollhardt, Kagakudojin), etc.

Incidentally, as mentioned above, a group represented by the above formula (1) may be previously connected to a monomer, which is a raw material of the charge-transporting polymer of the invention, and then polymerized to give the charge-transporting polymer of the invention. In addition, it is also possible that a moiety corresponding to the main chain of the charge-transporting polymer of the invention is synthesized, and then a group represented by formula (1) connects to the desired moiety.

As methods for purifying a compound, known techniques may be applied, including the methods described in "*Bunri-Seisei Gijutsu Handobukku* (Handbook of Separation/Purification Techniques)" (1993, edited by Chemical Society of Japan), "*Kagaku-Henkan-Ho niyoru Biryo-Seibun oyobi Nan-Seisei-Busshitsu no Kodo-Bunri* (Advanced Separation of Trace Components and Difficult-to-Purify Materials by Chemical Conversion Method)" (1988, published by IPC), and "*Jikken Kagaku Koza* (Lecture on Experimental Chemistry), (Fourth Edition), 1", the section of "*Bunri to Seisei* (Separation and Purification)", (1990, edited by Chemical Society of Japan). Specific examples thereof include extraction (including suspension washing, boil-washing, ultrasonic cleaning, acid base washing), adsorption, occlusion, melting, crystallization (including recrystallization from a solvent, reprecipitation), distillation (atmospheric distillation, reduced-pressure distillation), evaporation, sublimation (atmospheric sublimation, reduced-pressure sublimation), ion exchange, dialysis, filtration, ultrafiltration, reverse osmosis, pressure osmosis, band dissolution, electrophoresis, centrifugation, floatation, sedimentation, magnetic separation, and various kinds of chromatography (form classification: column, paper, thin layer, and capillary; mobile phase classification: gas, liquid, micelle, and supercritical fluid; separation mechanism: adsorption, partition, ion exchange, molecular sieve, chelate, gel filtration, exclusion, and affinity).

As methods for product identification and purity analysis, the following may be applied as necessary: a gas chromatograph (GC), a high-performance liquid chromatograph (HPLC), a high-speed amino acid analyzer (organic compound), capillary electrophoretic measurement (CE), a size exclusion chromatograph (SEC), a gel permeation chromatograph (GPC), a cross-fractionation chromatograph (CFC), mass spectroscopy (MS, LC/MS, GC/MS, MS/MS), a nuclear magnetic resonance apparatus (NMR (1HNMR, 13CNMR)), a Fourier transform infrared spectrophotometer (FT-IR), an ultraviolet-visible-near infrared spectrophotometer (UV.VIS, NIR), an electron spin resonance apparatus (ESR), a transmission electron microscope (TEM-EDX), an electron probe microanalyzer (EPMA), metal element analysis (an ion chromatograph, inductively coupled plasma-atomic emission spectrometry (ICP-AES), atomic absorption spectrometry (AAS), a fluorescent X-ray analyzer (XRF)), non-metal element analysis, trace analysis (ICP-MS, GF-AAS, GD-MS), etc.

<Composition for Organic Electroluminescent Element>

The composition for an organic electroluminescent element of the invention is a composition containing the charge-transporting polymer of the invention and a solvent.

For an organic electroluminescent element having an organic layer disposed between an anode and a cathode, the composition for an organic electroluminescent element of the invention is usually used as a coating liquid to form the organic layer by a wet film-forming method. Of such organic layers, it is preferable that the composition for an organic electroluminescent element of the invention is used to form a hole injection layer and/or a hole transport layer.

Incidentally, here, in the case where there is one layer between the anode and the light-emitting layer in an organic electroluminescent element, the layer is called a "hole transport layer", while in the case where there are two or more layers, the layer that is in contact with the anode is called a "hole injection layer", and other layers are collectively called "hole transport layers." In addition, layers provided between the anode and the light-emitting layer are sometimes collectively called "hole injection/transport layers."

The composition for an organic electroluminescent element of the invention is characterized by containing the charge-transporting polymer of the invention, and usually further contains a solvent.

It is preferable that the solvent is one that dissolves the charge-transporting polymer of the invention. The solvent usually dissolves 0.05 wt % or more, preferably 0.5 wt % or more, still more preferably 1 wt % or more, of the polymer compound at normal temperature.

In the case where the composition for an organic electroluminescent element of the invention is used to form a hole injection layer, in order to decrease the resistance of the formed layer, it is preferable that the composition further contains an electron-accepting compound.

It is preferable that the electron-accepting compound is a compound that has oxidizing power and is capable of accepting an electron from the hole-transporting compound. Specifically, a compound having an electron affinity of 4 eV or more is preferable, and a compound having an electron affinity of 5 eV or more is still more preferable.

Examples of electron-accepting compounds include organic-group-substituted onium salts such as 4-isopropyl-4'-methyldiphenyliodonium tetrakis(pentafluorophenyl)borate (WO 2005/089024), iron(III) chloride (JP-A-11-251067), high-valent inorganic compounds such as ammonium peroxodisulfate, cyano compounds such as tetracyanoethylene, aromatic boron compounds such as tris(pentafluorophenyl)borane (JP-A-2003-31365), fullerene derivatives, and iodine.

Among the above compounds, in terms of having strong oxidizing power, organic-group-substituted onium salts, high-valent inorganic compounds, and the like are preferable. In addition, in terms of having high solubility in various solvents and being applicable to film formation by a wet film-forming method, organic-group-substituted onium salts, cyano compounds, aromatic boron compounds, and the like are preferable.

Solvents to be contained in the composition for an organic electroluminescent element of the invention are not particularly limited. However, because it is necessary to dissolve the polymer of the invention, ether solvents, ester solvents, aromatic hydrocarbon solvents, amide solvents, and the like are preferable.

Examples of ether solvents include aliphatic ethers such as ethylene glycol dimethyl ether, ethylene glycol diethyl ether, and propylene glycol 1-monomethyl ether acetate (PGMEA) and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of ester solvents include aromatic esters such as phenyl acetate, phenyl propionate, methyl benzoate, ethyl benzoate, propyl benzoate, and n-butyl benzoate.

Examples of aromatic hydrocarbon solvents include toluene, xylene, cyclohexylbenzene, 3-isopropylbiphenyl, 1,2,3,4-tetramethylbenzene, 1,4-diisopropylbenzene, cyclohexylbenzene, and methylnaphthalene. Examples of amide solvents include N,N-dimethylformamide and N,N-dimethylacetamide.

In addition to them, it is also possible to use dimethyl sulfoxide, for example.

The concentration of the solvent in the composition is usually 10 wt % or more, preferably 30 wt % or more, and more preferably 50 wt % or more.

(Method for Forming Organic Thin Film)

In the case where a film is formed using the composition for an organic electroluminescent element of the invention, application is usually followed by heating. The heating technique is not particularly limited. In the case of drying by heating, the conditions are such that the layer formed using the composition for an organic electroluminescent element is heated to usually 100° C. or more, preferably 120° C. or more, more preferably 150° C. or more, and usually 400° C. or less, preferably 350° C. or less, more preferably 300° C. or less. The heating time is usually 1 minute or more and 24 hours or less. The heating means is not particularly limited, and may be such that a laminate having the formed layer is placed on a hot plate or heated in an oven, for example. It is possible to employ conditions where the heating is performed on a hot plate at 120° C. or more for 1 minute or more, for example.

<Organic Electroluminescent Element>

Hereinafter, embodiments of the organic electroluminescent element, organic electroluminescence lighting device, and organic electroluminescence display device of the invention will be described in detail. However, within the gist thereof, the invention is not limited thereto.

(Substrate)

The substrate serves as a support of the organic electroluminescent element. A plate of quartz or glass, a metal plate, a metal foil, a plastic film or sheet, or the like is usually used. Among them, glass plates and transparent plates made of a synthetic resin such as polyester, polymethacrylate, polycarbonate, polysulfone, or the like are preferable. In order to make the organic electroluminescent element less likely to be degraded due to outdoor air, it is preferable that the substrate is made of a material having high gas barrier properties. Accordingly, in the case of using a material having low gas barrier properties, especially such as a substrate made of a synthetic resin, it is preferable to provide a dense silicon oxide film or the like on at least one side of the substrate to increase the gas barrier properties.

(Anode)

The anode functions to inject holes into a layer on the light-emitting layer side. The anode is usually made of a metal such as aluminum, gold, silver, nickel, palladium, or platinum; a metal oxide such as an oxide of indium and/or tin; a halogenated metal such as copper iodide; carbon black, an electrically conductive polymer such as poly(3-methylthiophene), polypyrrole, or polyaniline; or the like. In many cases, the anode is usually formed by a dry process, such as a spattering method or a vacuum deposition method. In addition, in the case of formation using fine particles of metal such as silver, fine particles of copper iodide or the like, carbon black, electrically conductive metal oxide fine particles, an electrically conductive polymer fine powder, or the like, the anode may be formed by dispersing them in a suitable binder resin solution and applying the dispersion onto the substrate. In addition, in the case of an electrically conductive polymer, the anode may also be formed by directly forming a thin film on the substrate by electrolytic polymerization or applying the electrically conductive polymer onto the substrate (Appl. Phys. Lett., vol. 60, p. 2711, 1992).

The anode usually has a monolayer structure, but may be suitably provided with a laminate structure. In the case where the anode has a laminate structure, a different electrically conductive material may be laminated on the first layer of the anode.

The thickness of the anode may be determined according to the required transparency, the material, etc. In the case where particularly high transparency is required, a thickness that provides a visible light transmittance of 60% or more is preferable, and a thickness that provides a transmittance of 80% or more preferably is still more preferable. The thickness of the anode is usually 5 nm or more, preferably 10 nm or more, and usually 1,000 nm or less, preferably 500 nm or less. Meanwhile, in the case where no transparency is required, the anode may have any thickness according to the required strength, etc. In this case, the thickness of the anode may be the same as that of the substrate.

In the case where a film is formed on the surface of the anode, it is preferable that the surface is treated with UV+ozone, oxygen plasma, argon plasma, or the like before film formation to remove impurities on the anode and also adjust the ionization potential to improve hole-injecting properties.

(Hole Injection Layer)

In order to enhance the function of transporting holes from the anode to the light-emitting layer side, it is preferable to use a hole injection layer. In the case where a hole injection layer is used, the hole injection layer is usually formed on the anode.

The thickness of the hole injection layer is usually 1 nm or more, preferably 5 nm or more, and usually 1,000 nm or less, preferably 500 nm or less.

The hole injection layer may be formed by a vacuum deposition method or a wet film-forming method. In terms of having excellent film-forming properties, a wet film-forming method is preferably used for the formation.

The hole injection layer preferably contains a hole-transporting compound and more preferably contains a hole-transporting compound and an electron-accepting compound. The hole injection layer preferably further contains a cation radical compound and particularly preferably contains a cation radical compound and a hole-transporting compound.

(Hole-Transporting Compound)

A composition for forming a hole injection layer usually contains a hole-transporting compound that forms a hole injection layer. In addition, in the case of a wet film-forming method, the composition usually further contains a solvent. It is preferable that the composition for forming a hole injection layer has high hole-transporting properties and is capable of efficiently transporting injected holes. Therefore, it is preferable that the composition has high hole mobility and is resistant to the formation of trap-causing impurities during production, use, etc. It is also preferable that the composition has excellent stability, a low ionization potential, and high transparency to visible light. In particular, in the case where the hole injection layer comes in contact with a light-emitting layer, it is preferable that the composition does not quench light emission from the light-emitting layer or does not form an exciplex with the light-emitting layer to decrease the efficiency of light emission.

As a hole-transporting compound, in terms of the barrier for charge injection from the anode to the hole injection layer, a compound having an ionization potential of 4.5 eV to 6.0 eV is preferable. Examples of hole-transporting compounds include aromatic amine compounds, phthalocyanine compounds, porphyrin compounds, oligothiophene compounds, polythiophene compounds, benzylphenyl compounds, compounds having a tertiary amine connected thereto via a fluorene group, hydrazone compounds, silazane compounds, and quinacridone compounds.

Among the compounds mentioned above, in terms of amorphousness and visible light transmittance, aromatic amine compounds are preferable, and aromatic tertiary amine compounds are particularly preferable. Here, aromatic tertiary amine compounds are compounds having an aromatic tertiary amine structure and include compounds having a group derived from an aromatic tertiary amine.

The kind of aromatic tertiary amine compound is not particularly limited. However, because uniform light emission is likely to be obtained by the surface-smoothing effect, it is preferable to use a polymer compound having a weight average molecular weight of 1,000 or more and 1,000,000 or less (polymerized compound having a series of repeating units).

Among them, it is preferable to use the charge-transporting polymers described herein.

Other preferred examples of aromatic tertiary amine compounds include polymer compounds having a repeating unit represented by the following formula (I).

[Chemical Formula 13]

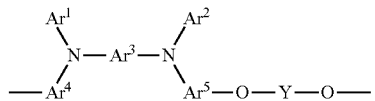

(I)

(In formula (I), $Ar^1$ and $Ar^e$ each independently represent an optionally substituted aromatic hydrocarbon group or an optionally substituted aromatic heterocyclic group. $Ar^3$ to $Ar^5$ each independently represent an optionally substituted aromatic hydrocarbon group or an optionally substituted aromatic heterocyclic group. Y represents a linking group selected from the group of linking groups given below. In addition, of $Ar^1$ to $Ar^5$, two groups connecting to the same N atom may connect to each other to form a ring.)

[Chemical Formula 14]

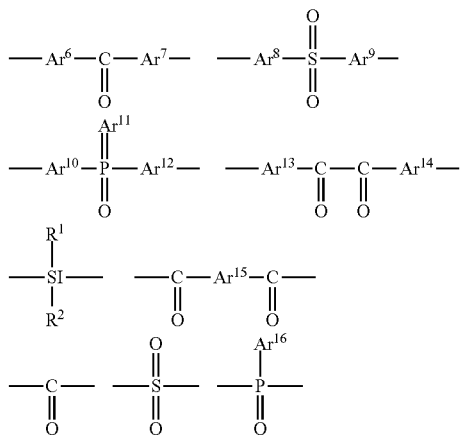

(In each of the above formulae, $Ar^6$ to $Ar^{16}$ each independently represent an optionally substituted aromatic hydrocarbon group or an optionally substituted aromatic heterocyclic group. $R^1$ and $R^2$ each independently represent a hydrogen atom or an optional substituent.)

As aromatic hydrocarbon groups and aromatic heterocyclic groups of $Ar^1$ to $Ar^{16}$, in terms of the solubility, heat resistance, and hole injection/transport properties of the polymer compound, groups derived from a benzene ring, a naphthalene ring, a phenanthrene ring, a thiophene ring, and a pyridine ring are preferable, and groups derived from a benzene ring and a naphthalene ring are still more preferable.

Specific examples of aromatic tertiary amine compounds having a repeating unit represented by formula (I) include those described in WO 2005/089024.

(Electron-Accepting Compound)

It is preferable that the hole injection layer contains an electron-accepting compound. This is because the electrical conductivity of the hole injection layer can be improved by the oxidation of the hole-transporting compound. Examples of electron-accepting compounds are as mentioned in <Composition for Organic electroluminescent element> above.

(Cation Radical Compound)

As a cation radical compound, an ionic compound containing a cation radical, which is a chemical species formed by removing an electron from a hole-transporting compound, and a counter anion is preferable. However, in the case where the cation radical is derived from a hole-transporting polymer compound, the cation radical has a structure formed by removing an electron from a repeating unit of the polymer compound.

It is preferable that the cation radical is a chemical species formed by removing an electron from the compounds mentioned above as hole-transporting compounds. In terms of amorphousness, visible light transmittance, heat resistance, solubility, etc., it is preferable that the cation radical is a chemical species formed by removing of an electron from a compound that is preferred as a hole-transporting compound.

Here, the cation radical compound can be produced by mixing the hole-transporting compound and electron-accepting compound mentioned above. That is, when the hole-transporting compound and the electron-accepting compound are mixed, electrons are transferred from the hole-transporting compound to the electron-accepting compound, resulting in the formation of a cationic compound having a cation radical of the hole-transporting compound and a counter anion.

Cation radical compounds derived from a polymer compound, such as PEDOT/PSS (Adv. Mater., 2000, vol. 12, p. 481) and an emeraldine hydrochloride (J. Phys. Chem., 1990, vol. 94, p. 7716), are also produced by oxidative polymerization (dehydrogenative polymerization).

Oxidative polymerization herein refers to the chemical or electrochemical oxidation of monomers in an acidic solution using peroxodisulfate or the like. In the case of oxidative polymerization (dehydrogenative polymerization), the monomers are oxidized and thus polymerized, and, at the same time, a cation radical formed by removing an electron from a repeating unit of the polymer, whose counter anion is an anion from the acidic solution, is produced.

<Formation of Hole Injection Layer by Wet Film-Forming Method>

In the case where the hole injection layer is formed by a wet film-forming method, usually, a material that forms a hole injection layer is mixed with a solvent in which the material is soluble (solvent for a hole injection layer) to prepare a composition for film formation (composition for forming a hole injection layer), and the composition for forming a hole injection layer is applied onto a layer that will be below the hole injection layer (usually the anode) to form a film, followed by drying to form the layer. It is preferable to use the composition for an organic electroluminescent element of the invention as the composition for forming a hole injection layer.

The concentration of the hole-transporting compound in the composition for forming a hole injection layer may be any concentration as long as the advantage of the invention is not significantly impaired. In terms of thickness uniformity, the lower the better. Meanwhile, in order to make the hole injection layer less likely to have defects, the higher the better. Specifically, the concentration is preferably 0.01 wt % or more, still more preferably 0.1 wt % or more, and particularly preferably 0.5 wt % or more. Meanwhile, it is preferably 70 wt % or less, still more preferably 60 wt % or less, and particularly preferably 50 wt % or less.

Examples of solvents include ether solvents, ester solvents, aromatic hydrocarbon solvents, and amide solvents. Example of solvents are as mentioned in <Composition for Organic electroluminescent element> above.

The formation of a hole injection layer by a wet film-forming method is usually performed as follows. A composition for forming a hole injection layer is prepared and then applied onto a layer that will be below the hole injection layer (usually the anode) to form a film, followed by drying.

With respect to the hole injection layer, usually, after film formation, the applied film is dried by heating, reduced-pressure drying, or the like.

<Formation of Hole Injection Layer by Vacuum Deposition Method>

In the case where the hole injection layer is formed by a vacuum deposition method, usually, one or more kinds of constituent materials for a hole injection layer (the above hole-transporting compound, electron-accepting compound, etc.) are placed in a crucible installed in a vacuum vessel (in the case of using two or more kinds of materials, the materials are usually each placed in a separate crucible), and the inside of the vacuum vessel is evacuated by a vacuum pump to about $10^{-4}$ Pa. The crucible is then heated (in the case of using two or more kinds of materials, usually the crucibles are each heated), and the material in the crucible is evaporated while controlling the amount of evaporation (in the case of using two or more kinds of materials, the materials are usually each independently evaporated while controlling the amount of evaporation), thereby forming a hole injection layer on the anode on the substrate placed facing the crucible(s). Incidentally, in the case of using two or more kinds of materials, it is also possible that a mixture thereof is placed in a crucible, heated, and evaporated to form a hole injection layer.

The degree of vacuum at the time of deposition is not limited as long as the advantage of the invention is not significantly impaired, and is usually $0.1 \times 10^{-6}$ Torr ($0.13 \times 10^{-4}$ Pa) or more and $9.0 \times 10^{-6}$ Torr ($12.0 \times 10^{-4}$ Pa) or less. The deposition rate is not limited as long as the advantage of the invention is not significantly impaired, and is usually 0.1 Å/sec or more and 5.0 Å/sec or less. The film-forming temperature at the time of deposition is not limited as long as the advantage of the invention is not significantly impaired, and it is preferably performed at 10° C. or more and 50° C. or less.

Incidentally, the hole injection layer may be crosslinked like the below-mentioned hole transport layer.

(Hole Transport Layer)

A hole transport layer is a layer that functions to transport holes from the anode side to the light-emitting layer side. In the organic electroluminescent element of the invention, the hole transport layer is not an indispensable layer. However, in order to enhance the function of transporting holes from the anode to the light-emitting layer, it is preferable to use this layer. In the case where a hole transport layer is used, the hole transport layer is usually formed between the anode and the light-emitting layer. In addition, in the case where the above hole injection layer is present, the hole transport layer is formed between the hole injection layer and the light-emitting layer.

The thickness of the hole transport layer is usually 5 nm or more, preferably 10 nm or more, and usually 300 nm or less, preferably 100 nm or less.

The hole transport layer may be formed by a vacuum deposition method or a wet film-forming method. In terms of having excellent film-forming properties, a wet film-forming method is preferably used for the formation.

The hole transport layer usually contains a hole-transporting compound that forms a hole transport layer. Examples of hole-transporting compounds to be contained in the hole transport layer include, in particular, aromatic diamines that contain two or more tertiary amines and that two or more fused aromatic rings are substituted on nitrogen atoms, such as 4,4'-bis[N-(1-naphthyl)-N-phenylamino]biphenyl (JP-A-5-234681); aromatic amine compounds having a starburst structure, such as 4,4',4"-tris(1-naphthylphenylamino)triphenylamine (J. Lumin., vols. 72 to 74, p. 985, 1997); aromatic amine compounds made of a tetramer of triphenylamine (Chem. Commun., p. 2175, 1996); spiro compounds such as 2,2',7,7'-tetrakis(diphenylamino)-9,9'-spirobifluorene (Synth. Metals, vol. 91, p. 209, 1997); and carbazole derivatives such as 4,4'-N,N'-dicarbazole biphenyl. In addition, it is also preferable to use polyvinyl carbazole, polyvinyl triphenylamine (JP-A-7-53953), polyarylene ether sulfone containing tetraphenylbenzidine (Polym. Adv. Tech., vol. 7, p 33, 1996), etc.

As for the hole injection layer, also for the hole transport layer, aromatic amine compounds are preferable in terms of amorphousness and visible light transmittance. It is preferable to use an aromatic tertiary amine compound. Here, aromatic tertiary amine compounds are compounds having an aromatic tertiary amine structure and include compounds having a group derived from an aromatic tertiary amine.

The kind of aromatic tertiary amine compound is not particularly limited. However, because uniform light emission is likely to be obtained by the surface-smoothing effect, it is preferable to use a polymer compound having a weight average molecular weight of 1,000 or more and 1,000,000 or less (polymerized compound having a series of repeating units).

Among them, it is preferable to use the charge-transporting polymers described herein.

<Formation of Hole Transport Layer by Wet Film-Forming Method>

In the case where the hole transport layer is formed by a wet film-forming method, usually, the layer is formed in the same manner as in the above case of forming a hole injection layer by a wet film-forming method using, instead of the composition for forming a hole injection layer, a composition for forming a hole transport layer. It is preferable to use the composition for an organic electroluminescent element of the invention as the composition for forming a hole transport layer.

In the case where the hole transport layer is formed by a wet film-forming method, the composition for forming a hole transport layer usually further contains a solvent. The solvent used for the composition for forming a hole injection layer may be the same as the solvent used for the composition for forming a hole transport layer mentioned above.

The concentration of the hole-transporting compound in the composition for forming a hole transport layer may be within the same range as the concentration of the hole-transporting compound in the composition for forming a hole injection layer.

The formation of a hole transport layer by a wet film-forming method may be performed in the same manner as the film-forming method for a hole injection layer mentioned above.

<Formation of Hole Transport Layer by Vacuum Deposition Method>

Also in the case where the hole transport layer is formed by a vacuum deposition method, usually, the layer may be formed in the same manner as in the above case of forming a hole injection layer by a vacuum deposition method using, instead of the composition for forming a hole injection layer, a composition for forming a hole transport layer. The film-forming conditions, such as the degree of vacuum at the time of deposition, the deposition rate, and the temperature, may be the same as the conditions for the vacuum deposition of a hole injection layer mentioned above.

(Light-Emitting Layer)

A light-emitting layer is a layer having the following function: when an electric field is applied between a pair of electrodes, the layer is excited by the recombination of holes injected from the anode and electrons injected from the cathode, and thus emits light. The light-emitting layer is a layer formed between the anode and the cathode. In the case where a hole injection layer is present on the anode, the light-emitting layer is formed between the hole injection layer and the cathode, while in the case where a hole transport layer is present on the anode, the layer is formed between the hole transport layer and the cathode.

The thickness of the light-emitting layer may be any thickness as long as the advantage of the invention is not significantly impaired. However, in order to make the film less likely to have defects, the thicker the better, while in order to facilitate the achievement of a low driving voltage, the thinner the better. Accordingly, the thickness is preferably 3 nm or more, and still more preferably 5 nm or more. Meanwhile, it is usually preferably 200 nm or less, and still more preferably 100 nm or less.

The light-emitting layer contains at least a material having light-emitting properties (light-emitting material) and preferably also contains a material having charge-transporting properties (charge-transporting material).

(Light-Emitting Material)

The light-emitting material is not particularly limited as long as it emits light at the desired light emission wavelength and does not impair the advantage of the invention, and known light-emitting materials are applicable. The light-emitting material may be a fluorescent light-emitting material or a phosphorescent light-emitting material. However, materials with excellent light emission efficiency are preferable. In terms of internal quantum efficiency, phosphorescent light-emitting materials are preferable.

Examples of fluorescent light-emitting materials include the following materials.

Examples of fluorescent light-emitting materials that emit blue light (fluorescent blue-emitting materials) include naphthalene, perylene, pyrene, anthracene, coumarin, chrysene, p-bis(2-phenylethenyl)benzene, and derivatives thereof.

Examples of fluorescent light-emitting materials that emit green light (fluorescent green-emitting materials) include quinacridone derivatives, coumarin derivatives, and aluminum complexes such as $Al(C_9H_6NO)_3$.

Examples of fluorescent light-emitting materials that emit yellow light (fluorescent yellow-emitting materials) include rubrene and perimidone derivatives.

Examples of fluorescent light-emitting materials that emit red light (fluorescent red-emitting materials) include DCM (4-(dicyanomethylene)-2-methyl-6-(p-dimethylaminostyryl)-4H-pyran) compounds, benzopyran derivatives, rhodamine derivatives, benzothioxanthene derivatives, and azabenzothioxanthene.

In addition, examples of phosphorescent light-emitting materials include organometallic complexes containing a metal selected from groups 7 to 11 of the long form of the periodic table (hereinafter, unless otherwise noted, "periodic table" refers to the long form of the periodic table). Preferred examples of metals selected from groups 7 to 11 of the periodic table include ruthenium, rhodium, palladium, silver, rhenium, osmium, iridium, platinum, and gold.

Preferred examples of ligands for organometallic complexes include ligands having a (hetero)aryl group connected to pyridine, pyrazole, phenanthroline, etc., such as (hetero)arylpyridine ligands and (hetero)arylpyrazole ligands. Phenylpyridine ligands and phenylpyrazole ligands are particularly preferable. Here, (hetero)aryl means an aryl group or a heteroaryl group.

Preferred examples of phosphorescent light-emitting materials include, specifically, phenylpyridine complexes such as tris(2-phenylpyridine) iridium, tris(2-phenylpyridine) ruthenium, tris(2-phenylpyridine) palladium, bis(2- phenylpyridine) platinum, tris(2-phenylpyridine) osmium, and tris(2-phenylpyridine) rhenium, and also porphyrin complexes such as octaethyl platinum porphyrin, octaphenyl platinum porphyrin, octaethyl palladium porphyrin, and octaphenyl palladium porphyrin.

Examples of polymeric light-emitting materials include polyfluorene materials such as poly(9,9-dioctylfluorene-2,7-diyl), poly[(9,9-dioctylfluorene-2,7-diyl)-co-(4,4'-(N-(4-sec-butylphenyl))diphenylamine)], and poly[(9,9-dioctylfluorene-2,7-diyl)-co-(1,4-benzo-2 {2,1'-3}-triazole)], and also polyphenylenevinylene materials such as poly[2-methoxy-5-(2-ethylhexyloxy)-1,4-phenylenevinylene].

(Charge-Transporting Material)

A charge-transporting material is a material capable of transporting a positive charge (hole) or a negative charge (electron). The material is not particularly limited as long as the advantage of the invention is not impaired, and known light-emitting materials are applicable.

As a charge-transporting material, compounds that have been conventionally used for a light-emitting layer of an organic electroluminescent element are usable, for example. Compounds used as host materials for a light-emitting layer are particularly preferable.

Specific examples of charge-transporting materials include the compounds mentioned as examples of hole-transporting compounds for the hole injection layer, such as aromatic amine compounds, phthalocyanine compounds, porphyrin compounds, oligothiophene compounds, polythiophene compounds, benzylphenyl compounds, compounds having a tertiary amine connected thereto via a fluorene group, hydrazone compounds, silazane compounds, silanamine compounds, phosphamine compounds, and quinacridone compounds. Examples also include electron-transporting compounds such as anthracene compounds, pyrene compounds, carbazole compounds, pyridine compounds, phenanthroline compounds, oxadiazole compounds, and silole compounds.

In addition, for example, the compounds mentioned as examples of hole-transporting compounds for the hole transport layer are also preferable, such as aromatic diamines that contain two or more tertiary amines and that two or more fused aromatic rings are substituted on nitrogen atoms, such as 4,4'-bis[N-(1-naphthyl)-N-phenylamino]biphenyl (JP-A-5-234681); aromatic amine compounds having a starburst structure, such as 4,4',4''-tris(1-naphthylphenylamino)triphenylamine (J. Lumin., vols. 72 to 74, p. 985, 1997); aromatic amine compounds made of a tetramer of triphenylamine (Chem. Commun., p. 2175, 1996), fluorene compounds such as 2,2',7,7'-tetrakis(diphenylamino)-9,9'-spirobifluorene (Synth. Metals, vol. 91, p. 209, 1997); and carbazole compounds such as 4,4'-N,N'-dicarbazole biphenyl. Examples also include oxadiazole compounds such as 2-(4-biphenylyl)-5-(p-tert-butylphenyl)-1,3,4-oxadiazole (tBu-PBD) and 2,5-bis(1-naphthyl)-1,3,4-oxadiazole (BND), silole compounds such as 2,5-bis(6'-(2',2''-bipyridyl)-1,1-dimethyl-3,4-diphenylsilole (PyPySPyPy), and phenanthroline compounds such as bathophenanthroline (BPhen) and 2,9-dimethyl-4,7-diphenyl-1,10-phenanthroline (BCP, bathocuproine).

<Formation of Light-Emitting Layer by Wet Film-Forming Method>

The light-emitting layer may be formed by a vacuum deposition method or a wet film-forming method. However, in terms of having excellent film-forming properties, a wet film-forming method is preferable, and a spin coating method and an ink jet method are still more preferable. In the case where the light-emitting layer is formed by a wet film-forming method, usually, the layer is formed in the same manner as in the above case of forming a hole injection layer by a wet film-forming method using, instead of the composition for forming a hole injection layer, a composition for forming a light-emitting layer prepared by mixing a material that forms a light-emitting layer with a solvent in which the material is soluble (solvent for a light-emitting layer).

Examples of solvents include the ether solvents, ester solvents, aromatic hydrocarbon solvents, and amide solvents mentioned for the formation of a hole injection layer, as well as alkane solvents, halogenated aromatic hydrocarbon solvents, aliphatic alcohol solvents, alicyclic alcohol solvents, aliphatic ketone solvents, and alicyclic ketone solvents. Specific examples of solvents will be given below. However, solvents are not limited thereto as long as the advantage of the invention is not impaired.

Examples include aliphatic ether solvents such as ethylene glycol dimethyl ether, ethylene glycol diethyl ether, and propylene glycol 1-monomethyl ether acetate (PGMEA); aromatic ether solvents such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic ester solvents such as phenyl acetate, phenyl propionate, methyl benzoate, ethyl benzoate, ethyl benzoate, propyl benzoate, and n-butyl benzoate; aromatic hydrocarbon solvents such as toluene, xylene, mesitylene, cyclohexylbenzene, tetralin, 3-isopropylbiphenyl, 1,2,3,4-tetramethylbenzene, 1,4-diisopropylbenzene, cyclohexylbenzene, and methylnaphthalene; amide solvents such as N,N-dimethylformamide and N,N-dimethylacetamide; alkane solvents such as n-decane, cyclohexane, ethylcyclohexane, decalin, and bicyclohexane; halogenated aromatic hydrocarbon solvents such as chlorobenzene, dichlorobenzene, and trichlorobenzene; aliphatic alcohol solvents such as butanol and hexanol; alicyclic alcohol solvents such as cyclohexanol and cyclooctanol; aliphatic ketone solvents such as methyl ethyl ketone and dibutyl ketone; and alicyclic ketone solvents such as cyclohexanone, cyclooctanone, and fenchone. Among them, alkane solvents and aromatic hydrocarbon solvents are particularly preferable.

(Hole-Blocking Layer)

A hole-blocking layer may be provided between the light-emitting layer and the below-mentioned electron injection layer. A hole-blocking layer is a layer to be laminated on the light-emitting layer to contact the cathode-side interface of the light-emitting layer.

The hole blocking layer functions to prevent holes coming from the anode from arriving at the cathode and also functions to efficiently transport electrons injected from the cathode toward the light-emitting layer. Physical properties required for the material forming the hole blocking layer include high electron mobility and low hole mobility, a large energy gap (difference between HOMO and LUMO), and a high excited triplet level (T1).

Examples of hole-blocking layer materials that satisfy these requirements include mixed ligand complexes such as bis(2-methyl-8-quinolinolato)(phenolate)aluminum and bis (2-methyl-8-quinolinolato)(triphenylsilanolato)aluminum, metal complexes such as bis(2-methyl-8-quinolato)aluminum-μ-oxobis-(2-methyl-8-quinolinato)aluminum dinuclear metal complexes, styryl compounds such as distyrylbiphenyl derivatives (JP-A-11-242996), triazole derivatives such as 3-(4-biphenylyl)-4-phenyl-5-(4-tert-butylphenyl)-1,2,4-triazole (JP-A-7-41759), and phenanthroline derivatives such as bathocuproine (JP-A-10-79297). Further, the compound having at least one pyridine ring substituted at 2-, 4-, and 6-positions described in WO 2005/022962 is also preferable as a hole-blocking layer material.

The method for forming a hole-blocking layer is not limited. Therefore, it can be formed by a wet film-forming method, a vapor deposition method, or other methods.

The thickness of the hole-blocking layer may be any thickness as long as the advantage of the invention is not significantly impaired. The thickness is usually 0.3 nm or more, preferably 0.5 nm or more, and usually 100 nm or less, preferably 50 nm or less.

(Electron Transport Layer)

An electron transport layer is provided between the light-emitting layer and the electron injection layer for the purpose of further improving the current efficiency of the element.

The electron transport layer is made of a compound capable of efficiently transporting, between electrodes having an electric field applied thereto, electrons injected from the cathode toward the light-emitting layer. The electron-transporting compound used for the electron transport layer has to be a compound that allows for highly efficient electron injection from the cathode or the electron injection layer, has high electron mobility, and is capable of efficiently transporting injected electrons.

It is usually preferable that the electron-transporting compound used for the electron transport layer is a compound that allows for highly efficient electron injection from the cathode or the electron injection layer and is capable of efficiently transporting injected electrons. Specific examples of electron-transporting compounds include metal complexes such as 8-hydroxyquinoline aluminum complexes (JP-A-59-194393), 10-hydroxybenzo[h]quinoline metal complexes, oxadiazole derivatives, distyrylbiphenyl derivatives, silole derivatives, 3-hydroxyflavone metal complexes, 5-hydroxyflavone metal complexes, benzoxazole metal complexes, benzothiazole metal complexes, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N'-dicyanoanthraquinonediimine, n-type hydrogenated amorphous silicon carbide, n-type zinc sulfide, and n-type zinc selenide.

The thickness of the electron transport layer is usually 1 nm or more, preferably 5 nm or more, and usually 300 nm or less, preferably 100 nm or less.

The electron transport layer is laminated and formed on the hole-blocking layer by a wet film-forming method or a vacuum deposition method in the same manner as above. Usually, a vacuum deposition method is used.

(Electron Injection Layer)

An electron injection layer functions to efficiently inject electrons injected from the cathode into the electron transport layer or the light-emitting layer.

In order to efficiently inject electrons, it is preferable that the material forming the electron injection layer is a metal having a low work function. Examples thereof include alkali metals such as sodium and cesium and alkaline-earth metals such as barium and calcium. The thickness is usually preferably 0.1 nm or more and 5 nm or less.

Further, in order to enable the achievement of improved electron injection/transport properties together with excellent film quality, it is also preferable to dope an organic electron transport material, such as bathophenanthroline or a like nitrogen-containing heterocyclic compound or an 8-hydroxyquinoline aluminum complex or like metal complex, with an alkali metal, such as sodium, potassium, cesium, lithium, or rubidium (described in JP-A-10-270171, JP-A-2002-100478, JP-A-2002-100482, etc.).

The thickness is usually 5 nm or more, preferably 10 nm or more, and usually 200 nm or less, preferably 100 nm or less.

The electron injection layer is laminated and formed on the light-emitting layer or the hole-blocking layer thereon by a wet film-forming method or a vacuum deposition method.

The details in the case of a wet film-forming method are the same as for the light-emitting layer.

(Cathode)

The cathode functions to inject electrons into a layer on the light-emitting layer side (electron injection layer, light-emitting layer, etc.).

As materials for the cathode, the materials for the anode mentioned above are usable. However, in order to effectively inject electrons, it is preferable to use a metal having a low work function. Examples thereof include metals such as tin, magnesium, indium, calcium, aluminum, and silver, as well as alloys thereof. Specific examples thereof include alloy electrodes having a work function, such as a magnesium-silver alloy, a magnesium-indium alloy, and an aluminum-lithium alloy.

In terms of element stability, it is preferable that a metal layer having a high work function and stable in the atmosphere is laminated on the cathode to protect the cathode made of a metal having a low work function. Examples of metals to be laminated include metals such as aluminum, silver, copper, nickel, chromium, gold, and platinum.

The thickness of the cathode is usually the same as that of the anode.

(Other Layers)

As long as the advantage of the invention is not significantly impaired, the organic electroluminescent element of the invention may further contain other layers. That is, in addition to those mentioned above, other optional layers may also be present between the anode and the cathode.

<Other Element Configurations>

Incidentally, the structure may be reverse to the above. That is, it is also possible to laminate, on the substrate, a cathode, an electron injection layer, a light-emitting layer, a hole injection layer, and an anode in this order.

<Others>

In the case where the organic electroluminescent element of the invention is applied to an organic electroluminescence apparatus, it may be used as a single organic electroluminescent element. It is also possible that a plurality of organic electroluminescent elements are arranged in an array, or the anode and the cathode are arranged in an X-Y matrix form.

<Organic EL Display Device>

The organic EL display device of the invention uses the organic electroluminescent element of the invention. The form and structure of the organic EL display device of the invention are not particularly limited, and it may be assembled in the usual manner using the organic electroluminescent element of the invention.

For example, the organic EL display device of the invention can be formed by the method described in "*Yuki EL Disupurei* (Organic EL Display)" (Ohmsha, Ltd., published on Aug. 20, 2004, written by Seiji Tokito, Chihaya Adachi, and Hideyuki Murata).

<Organic EL Light>

The organic EL light of the invention uses the organic electroluminescent element of the invention. The form and structure of the organic EL light of the invention are not particularly limited, and it may be assembled in the usual manner using the organic electroluminescent element of the invention.

EXAMPLES

Next, the invention will be described in further detail with reference to examples. However, within the gist thereof, the invention is not limited to the following examples.
(Synthesis of Monomers)
<Synthesis of Compound 1>

[Chemical Formula 15]

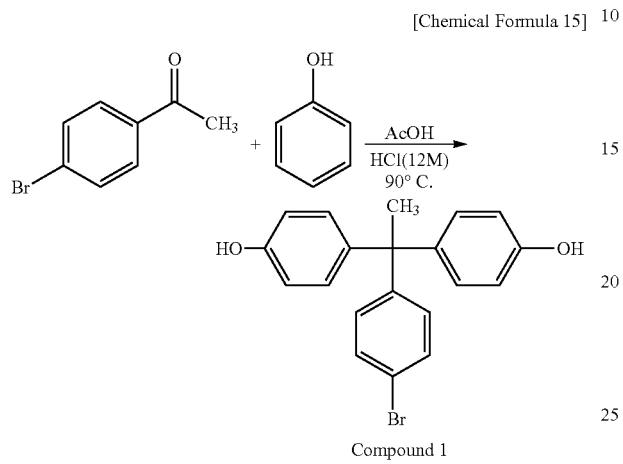

Compound 1

13.2 g (66.41 mmol) of 4'-bromoacetophenone, 75.0 g (796.94 mmol) of phenol, and 85 mL of acetic acid were placed in a flask in a nitrogen gas stream and stirred at room temperature. 240 mL of hydrochloric acid (12 M) was added thereto, followed by heating at reflux at 90° C. for 24 hours. After the reaction, the reaction mixture was poured into hot water. The insoluble matter was collected, dissolved in ethyl acetate, washed with water, dried over magnesium sulfate, and concentrated. The concentrate was further purified by silica gel column chromatography (hexane:ethyl acetate=4:1) to give a compound 1 (11.73 g).
<Synthesis of Compound 3>

[Chemical Formula 16]

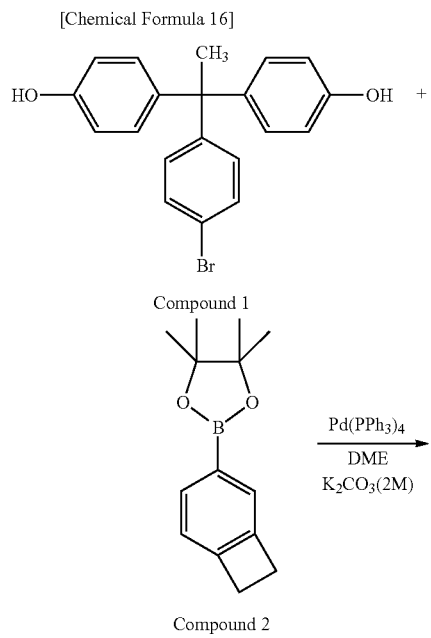

Compound 2

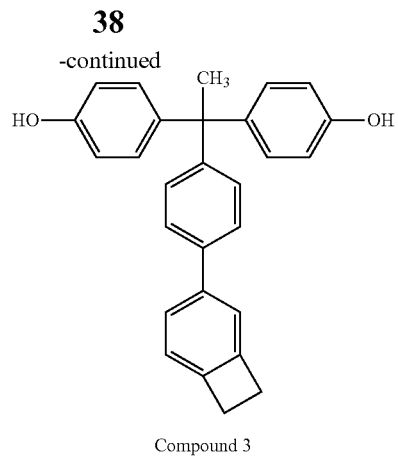

Compound 3

11.73 g (31.77 mmol) of the compound 1, 8.05 g (34.94 mmol) of the compound 2, and 200 mL of 1,2-dimethoxyethane were placed in a flask in a nitrogen gas stream and stirred at room temperature. 75 mL of a 2 M aqueous potassium carbonate solution was added thereto, and nitrogen was bubbled at room temperature for 30 minutes. Next, 0.75 g (0.65 mmol) of tetrakis(triphenylphosphine)palladium was added thereto and heated at reflux under nitrogen for 5 hours. The mixture was allowed to cool, followed by extraction with ethyl acetate, washing with water, drying over magnesium sulfate, and concentration. The concentrate was further purified by silica gel column chromatography (hexane:ethyl acetate=3:1) to give a compound 3 (10.8 g).
<Synthesis of Compound 4>

[Chemical Formula 17]

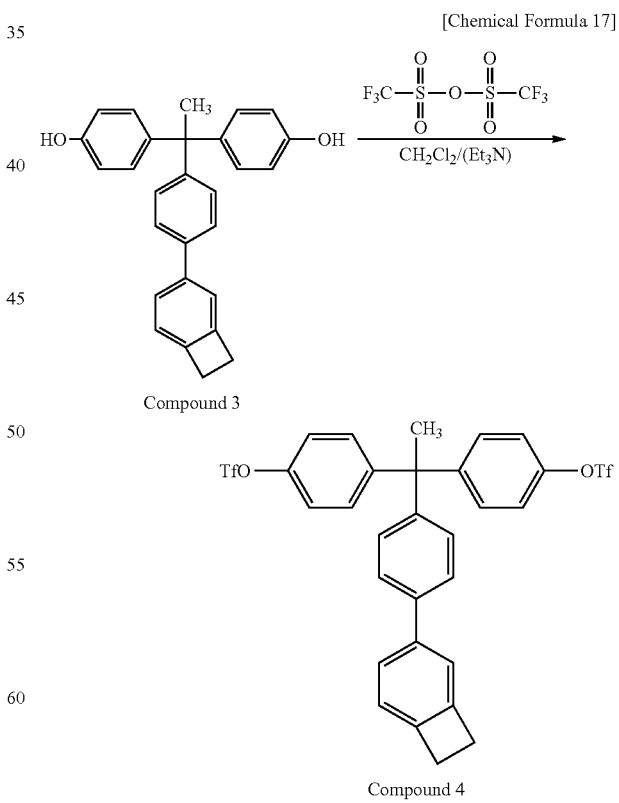

Compound 4

14.8 g (37.71 mmol) of the compound 3 was dissolved at −5° C. in a mixture of methylene chloride (250 ml) and 19.0 g (188.5 mmol) of triethylamine, and 31.9 g (113.13 mmol) of trifluoromethanesulfonic anhydride was dissolved in 70 ml of methylene chloride and slowly added dropwise to the solution. After stirring for 4 hours, the reaction mixture was poured into ice water, followed by extraction with methylene chloride, washing with water, drying over magnesium sulfate, and concentration. The concentrate was further purified by silica gel column chromatography (hexane:methylene chloride=3:1) to give a compound 4 (19.5 g).

<Synthesis of Compound 5>

<Synthesis of Compound 6>

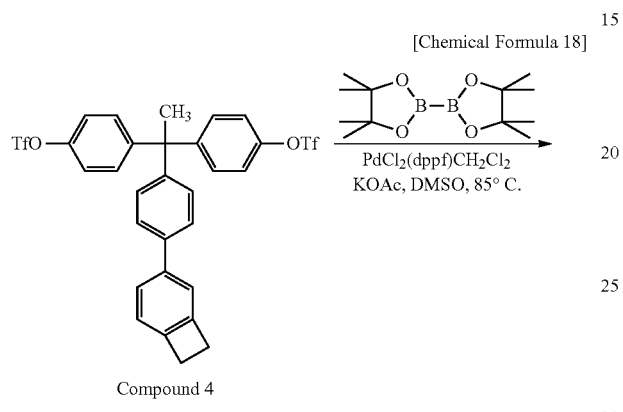

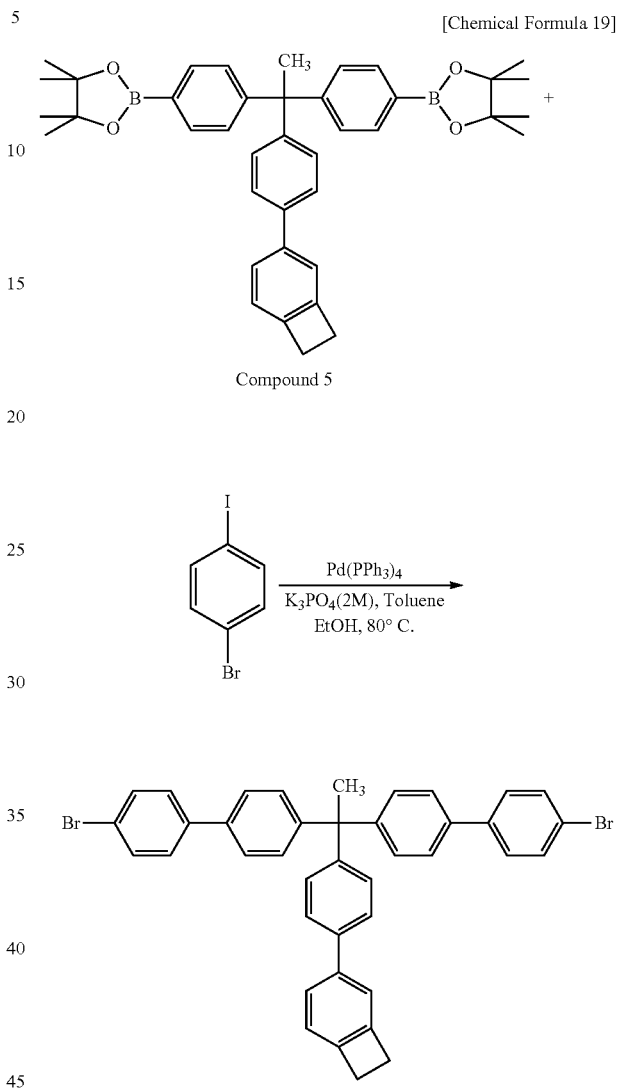

200 ml of dimethyl sulfoxide, 19.5 g (29.70 mmol) of the compound 4, 18.1 g (71.28 mmol) of bis(pinacolato)diboron, and 17.5 g (178.2 mmol) of potassium acetate were placed in a 500-ml flask in a nitrogen gas stream and stirred at 60° C. for 30 minutes. Subsequently, 1.2 g (1.49 mmol) of 1,1'-bis (diphenylphosphino)ferrocene-palladium(II) dichloride-dichloromethane [PdCl$_2$(dppf)CH$_2$Cl$_2$] was added thereto, followed by heating and stirring at 85° C. for 4 hours. The reaction mixture was filtered under reduced pressure, and toluene was added to the filtrate, followed by washing with water and drying over anhydrous magnesium sulfate. After filtration, the filtrate was concentrated and washed with methanol to give a compound 5 as a colorless solid (the amount of yield: 15.0 g, yield: 82.5%).

In a nitrogen gas stream, 300 ml of toluene, 100 ml of ethanol, 15.0 g (24.49 mmol) of the compound 5, 14.5 g (51.43 mmol) of 1-bromo-4-iodobenzene, and 100 ml of an aqueous potassium phosphate solution (2 M, i.e., a concentration of 2 mol/L) were placed in a 1,000-ml flask, and heated and stirred at 60° C. for 30 minutes. Subsequently, 0.57 g (0.49 mmol) of tetrakis(triphenylphosphine)palladium [Pd(PPh$_3$)$_4$] was added thereto, followed by refluxing for 5 hours. Water was added to the reaction mixture, followed by extraction with toluene. Magnesium sulfate and activated clay were added thereto, the mixture was stirred and then filtered, and the filtrate was concentrated. The concentrate was purified by silica gel column chromatography (developing solvent: n-hexane:methylene chloride=4:1) to give the desired compound as a colorless solid (the amount of yield: 4.8 g, yield 29.2%).

<Synthesis of Compound 7>

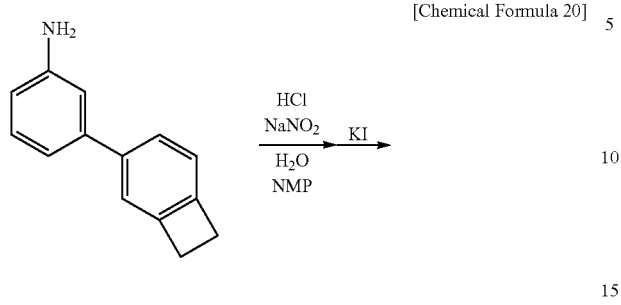

[Chemical Formula 20]

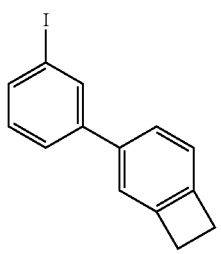

Compound 7

8.77 g (45 mmol) of 4-(3-aminophenyl)benzocyclobutene and 60 mL of N-methylpyrrolidone were mixed and cooled to −5° C. 8.59 mL (99 mmol) of concentrated hydrochloric acid and 30 mL of desalinated water were added thereto, followed by stirring for 30 minutes. Then, an aqueous sodium nitrite solution (3.20 g (46.35 mmol), 30 mL) cooled to −5° C. was added thereto at 5° C. or less, followed by stirring for 30 minutes to give a diazonium salt solution. The diazonium salt solution was added dropwise to an aqueous potassium iodide solution (22.63 g (136.35 mmol), 400 mL) heated to 60° C., followed by stirring for 2 hours. Dichloromethane was added to the reaction mixture for extraction, and the extract was washed with water and then washed with a sodium thiosulfate solution. Magnesium sulfate was then added thereto, the mixture was stirred and then filtered, and the filtrate was concentrated. The concentrate was purified by silica gel column chromatography (developing solvent: n-hexane) to give the desired compound as a colorless oil (the amount of yield: 7.8, yield: 56.6%).

<Synthesis of Compound 8>

[Chemical Formula 21]

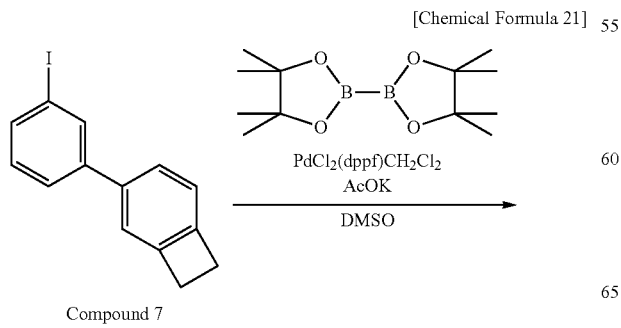

Compound 7

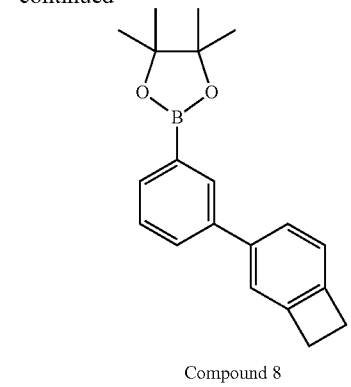

Compound 8

In a nitrogen gas stream, 100 ml of dimethyl sulfoxide, 5.00 g (16.3 mmol) of the compound 7, 5.39 g (21.2 mmol) of bis(pinacolato)diboron, and 4.00 g (40.8 mmol) of potassium acetate were placed in a 200-ml flask and stirred at 60° C. for 30 minutes. Subsequently, 0.33 g (0.41 mmol) of 1,1'-bis (diphenylphosphino)ferrocene-palladium(II) dichloride-dichloromethane [PdCl₂(dppf)CH₂Cl₂] was added thereto, followed by heating and stirring at 85° C. for 8 hours. Toluene was added to the reaction mixture, followed by washing with water, magnesium sulfate was added thereto, and the mixture was stirred and then filtered. Activated clay was added to the filtrate, and the mixture was stirred and then filtered. The filtrate was concentrated to give a compound 8 as a colorless solid (the amount of yield: 4.71 g, yield 94.2%).

<Synthesis of Compound 9>

[Chemical Formula 22]

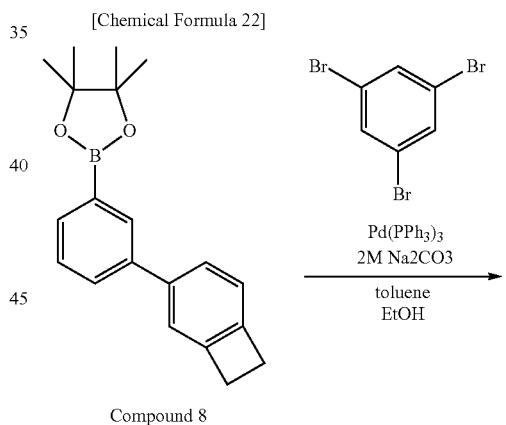

Compound 8

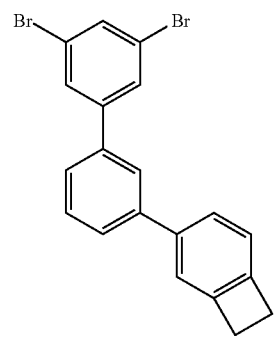

Compound 9

In a nitrogen gas stream, 100 ml of toluene, 50 ml of ethanol, 4.00 g (13.1 mmol) of the compound 8, 4.11 g (13.1 mmol) of 1,3,5-tribromobenzene, and 50 ml of a 2 M aqueous sodium carbonate solution were placed in a 300-ml flask, and heated and stirred at 60° C. for 30 minutes. Subsequently, 0.30 g (0.26 mmol) of tetrakis(triphenylphosphine)palladium [Pd(PPh₃)₄] was added thereto, followed by refluxing for 2 hours. Water was added to the reaction mixture, followed by extraction with toluene. Magnesium sulfate and activated clay were added thereto, the mixture was stirred and then filtered, and the filtrate was concentrated. The concentrate was purified by silica gel column chromatography (developing solvent: n-hexane:toluene=5:1) to give the desired compound as a colorless oil (the amount of yield: 3.89 g, yield 71.9%).

Example 1 butylphosphine (0.405 g, 2.00 mmol) was added to a 20-ml toluene solution of a tris(dibenzylideneacetone)dipalladium chloroform complex (0.259 g, 0.25 mmol) and heated to 60° C. (solution B). In a nitrogen gas stream, the solution B was added to the solution A, followed by heating at reflux to cause a reaction for 2.0 hours. Then, 2,2-bis[4-(4-bromophenyl)phenyl]-4-methylpentane (5.60 g, 8.56 mmol) and the compound 6 (1.04 g, 1.55 mmol) were further added thereto. After heating at reflux for 2.0 hours, the reaction mixture was allowed to cool and then added dropwise to 1,200 ml of ethanol to crystallize a crude polymer 1.

The obtained crude polymer 1 was dissolved in 350 ml of toluene. N,N-diphenylamine (1.69 g) and sodium tert-butoxide (7.69 g) were charged, and the system was fully purged with nitrogen and heated to 60° C. (solution C). Tri-tert-butylphosphine (0.405 g, 2.00 mmol) was added to a 20-ml

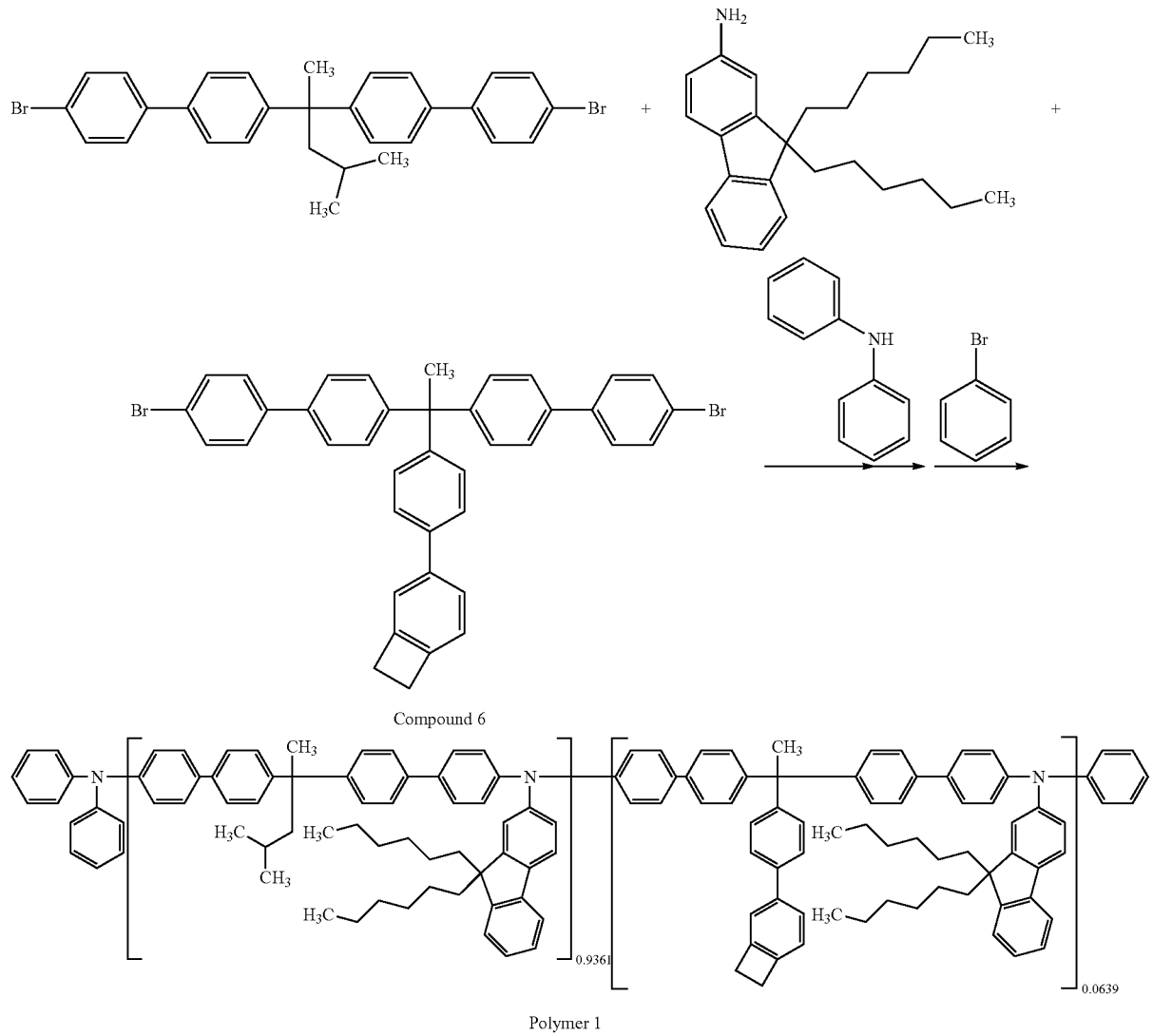

2,2-Bis[4-(4-bromophenyl)phenyl]-4-methylpentane (6.85 g, 12.50 mmol), 2-amino-9,9-dihexylfluorene (8.74 g, 25.00 mmol), sodium tert-butoxide (7.69 g, 80.00 mmol), and toluene (130 ml) were charged. The system was fully purged with nitrogen and heated to 60° C. (solution A). Tri-terttoluene solution of a tris(dibenzylideneacetone)dipalladium chloroform complex (0.259 g, 0.25 mmol) and heated to 60° C. (solution D). In a nitrogen gas stream, the solution D was added to the solution C, followed by heating at reflux to cause a reaction for 3 hours. Bromobenzene (3.93 g) was added thereto, followed by heating at reflux to cause a reaction for 3 hours. The reaction mixture was allowed to cool and added dropwise to an ethanol (1,500 ml) solution to give an end-capped crude polymer 1.

The end-capped crude polymer 1 was dissolved in toluene, washed with dilute hydrochloric acid, and reprecipitated in ammonia-containing ethanol. The obtained polymer was dissolved in toluene and reprecipitated in acetone, and the precipitated polymer was collected by filtration. The obtained polymer was purified by column chromatography to give a polymer 1 (3.1 g).

Weight average molecular weight (Mw)=192,000
Number average molecular weight (Mn)=98,600
Dispersion (Mw/Mn)=1.95

Example 2

4,4"-Dibromo-p-terphenyl (8.100 g, 20.8709 mmol), 2-amino-9,9-dihexylfluorene (14.591 g, 41.7418 mmol), sodium tert-butoxide (15.464 g, 160.9147 mmol), and toluene (60 ml) were charged, and the system was fully purged with nitrogen and heated to 95° C. (solution A). Tri-tert-butylphosphine (1.140 g, 5.6351 mmol) was added to a 13-ml toluene solution of a tris(dibenzylideneacetone)dipalladium chloroform complex (0.432 g, 0.4174 mmol) and heated to 60° C. (solution B). In a nitrogen gas stream, the solution B was added to the solution A, followed by heating at reflux to cause a reaction for 2.0 hours. Confirming that 4,4"-dibromo-p-terphenyl and 2-amino-9,9-dihexylfluorene had disappeared, 4,4"-dibromo-p-terphenyl (7.160 g, 18.4499 mmol) and the compound 6 (1.259 g, 1.8784 mmol) were further added thereto. After heating at reflux for 1.0 hour, the reaction mixture was allowed to cool and then added dropwise to 3,000 ml of ethanol to crystallize a crude polymer 2.

[Chemical Formula 24]

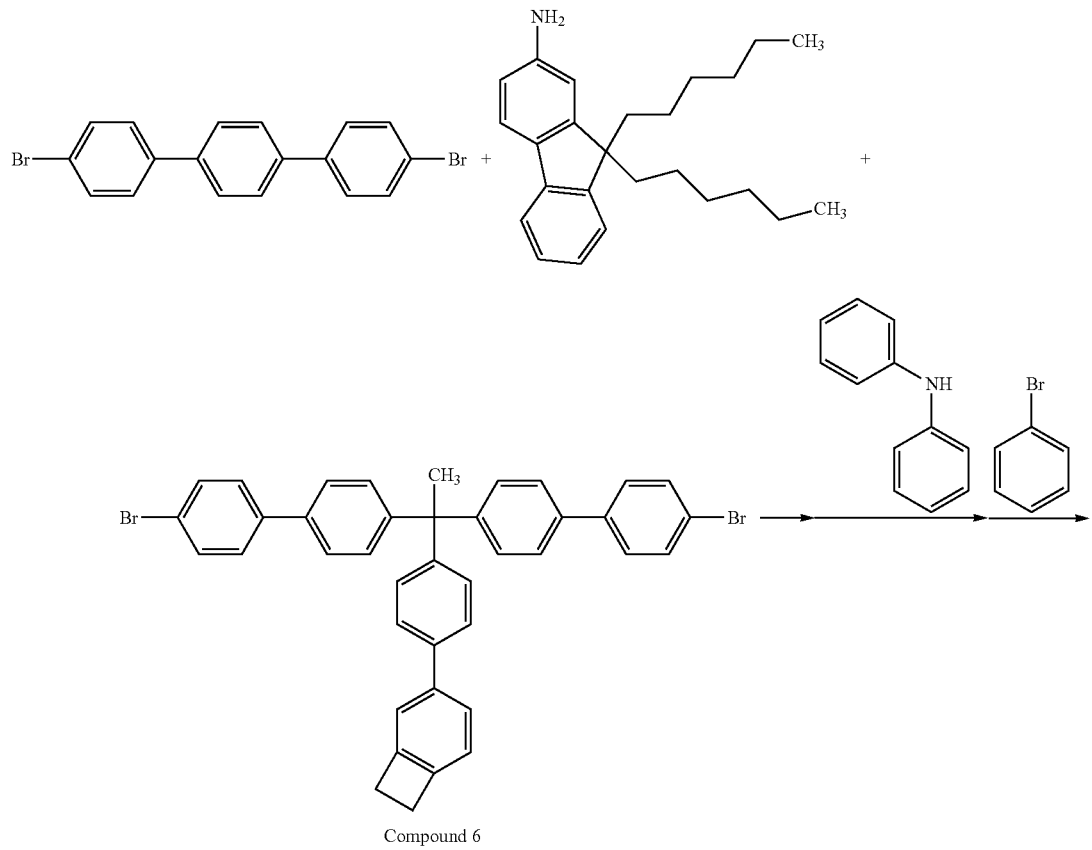

Compound 6

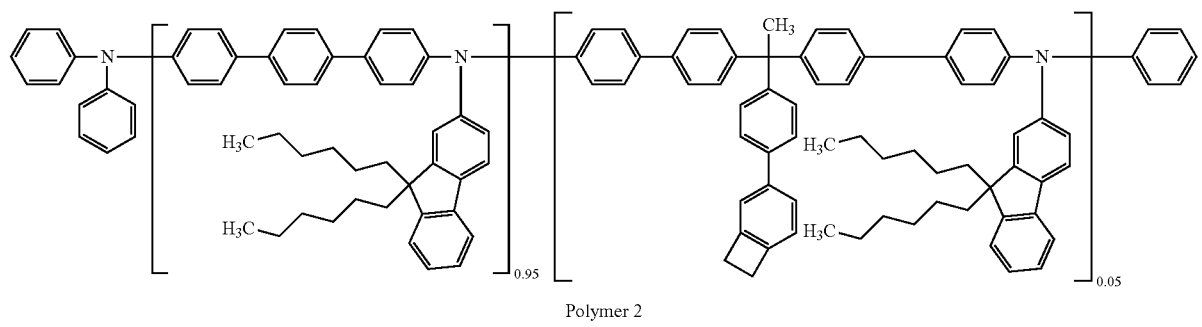

Polymer 2

The obtained crude polymer 2 was dissolved in 650 ml of toluene. N,N-diphenylamine (1.4 g) and sodium tert-butoxide (7.7 g) were charged, and the system was fully purged with nitrogen and heated to 60° C. (solution C). Tri-tert-butylphosphine (1.140 g, 5.6351 mmol) was added to a 13-ml toluene solution of a tris(dibenzylideneacetone)dipalladium chloroform complex (0.432 g, 0.4174 mmol) and heated to 60° C. (solution D). In a nitrogen gas stream, the solution D was added to the solution C, followed by heating at reflux to cause a reaction for 3 hours. Bromobenzene (6.6 g) was added thereto, followed by heating at reflux to cause a reaction for 3 hours. The reaction mixture was allowed to cool and added dropwise to an ethanol (3,000 ml) solution to give an end-capped crude polymer 2.

The end-capped crude polymer 2 was dissolved in toluene, washed with dilute hydrochloric acid, and reprecipitated in ammonia-containing ethanol. The obtained polymer was dissolved in toluene and reprecipitated in acetone, and the precipitated polymer was collected by filtration. The obtained polymer was purified by column chromatography to give a polymer 2 (9.8 g).

Weight average molecular weight (Mw)=73,800

Number average molecular weight (Mn)=49,400

Dispersion (Mw/Mn)=1.49

Example 3

[Chemical Formula 25]

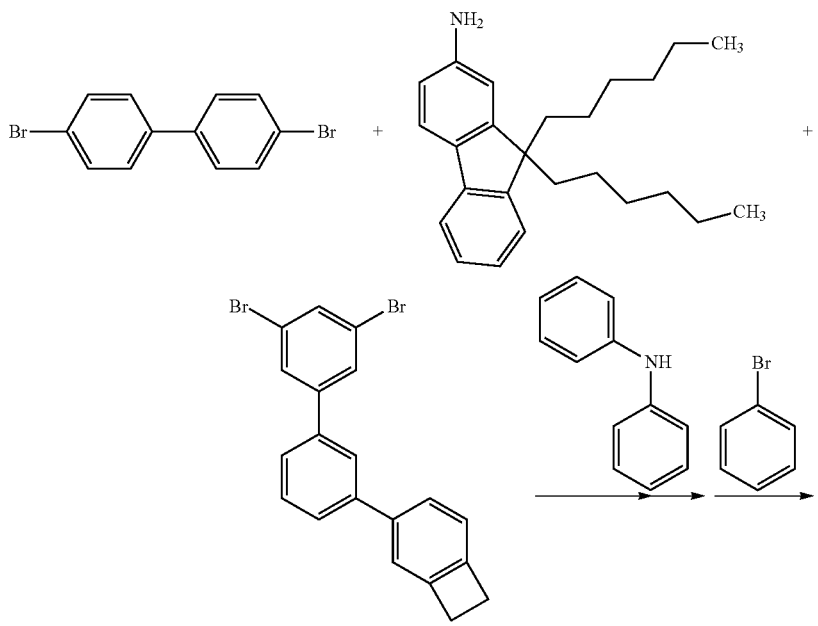

Compound 9

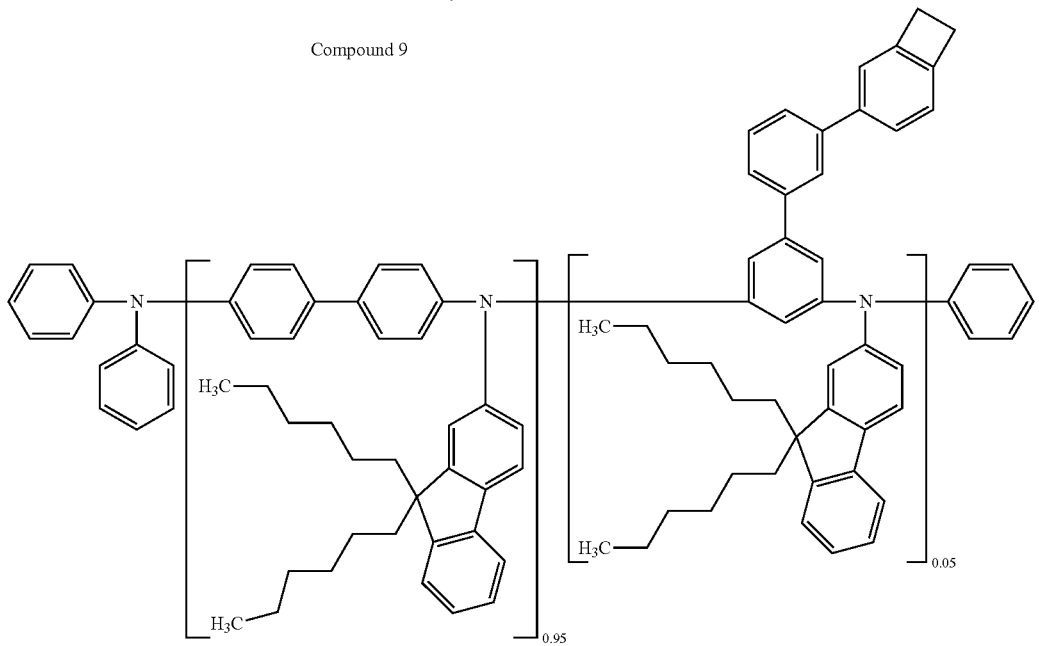

Polymer 4

4,4'-Dibromobiphenyl (1.25 g, 4.00 mmol), 2-amino-9,9-dihexylfluorene (2.80 g, 8.00 mmol), sodium tert-butoxide (2.61 g, 24.0 mmol), and toluene (22 ml) were charged, and the system was fully purged with nitrogen and heated to 95° C. (solution A). Tri-tert-butylphosphine (0.13 g, 0.64 mmol) was added to a 4-ml toluene solution of a tris(dibenzylideneacetone)dipalladium chloroform complex (0.083 g, 0.080 mmol) and heated to 60° C. (solution B). In a nitrogen gas stream, the solution B was added to the solution A, followed by heating at reflux to cause a reaction for 2.0 hours. 4,4'-Dibromobiphenyl (1.00 g, 3.20 mmol) and the compound 9 (0.166 g, 0.400 mmol) were further added thereto. After heating at reflux for 1.0 hour, the reaction mixture was allowed to cool and then added dropwise to 300 ml of ethanol to crystallize a crude polymer 4.

The obtained crude polymer 4 was dissolved in 55 ml of toluene. N,N-diphenylamine (0.27 g) and sodium tert-butoxide (1.48 g) were charged, and the system was fully purged with nitrogen and heated to 60° C. (solution C). Tri-tert-butylphosphine (0.069 g) was added to a 4-ml toluene solution of a tris(dibenzylideneacetone)dipalladium chloroform complex (0.041 g) and heated to 60° C. (solution D). In a nitrogen gas stream, the solution D was added to the solution C, followed by heating at reflux to cause a reaction for 3 hours. Bromobenzene (1.26 g) was added thereto, and the solution D was added thereto again, followed by heating at reflux to cause a reaction for 3 hours. The reaction mixture was allowed to cool and added dropwise to an ethanol (3,500 ml) solution to give an end-capped crude polymer 4.

The end-capped crude polymer 4 was dissolved in toluene, washed with dilute hydrochloric acid, and reprecipitated in ammonia-containing ethanol. The obtained polymer was dissolved in toluene and reprecipitated in acetone, and the precipitated polymer was collected by filtration. The obtained polymer was purified by column chromatography to give a polymer 4 (1.47 g).

Weight average molecular weight (Mw)=63,400
Number average molecular weight (Mn)=43,100
Dispersion (Mw/Mn)=1.47

Comparative Example 1

[Chemical Formula 26]

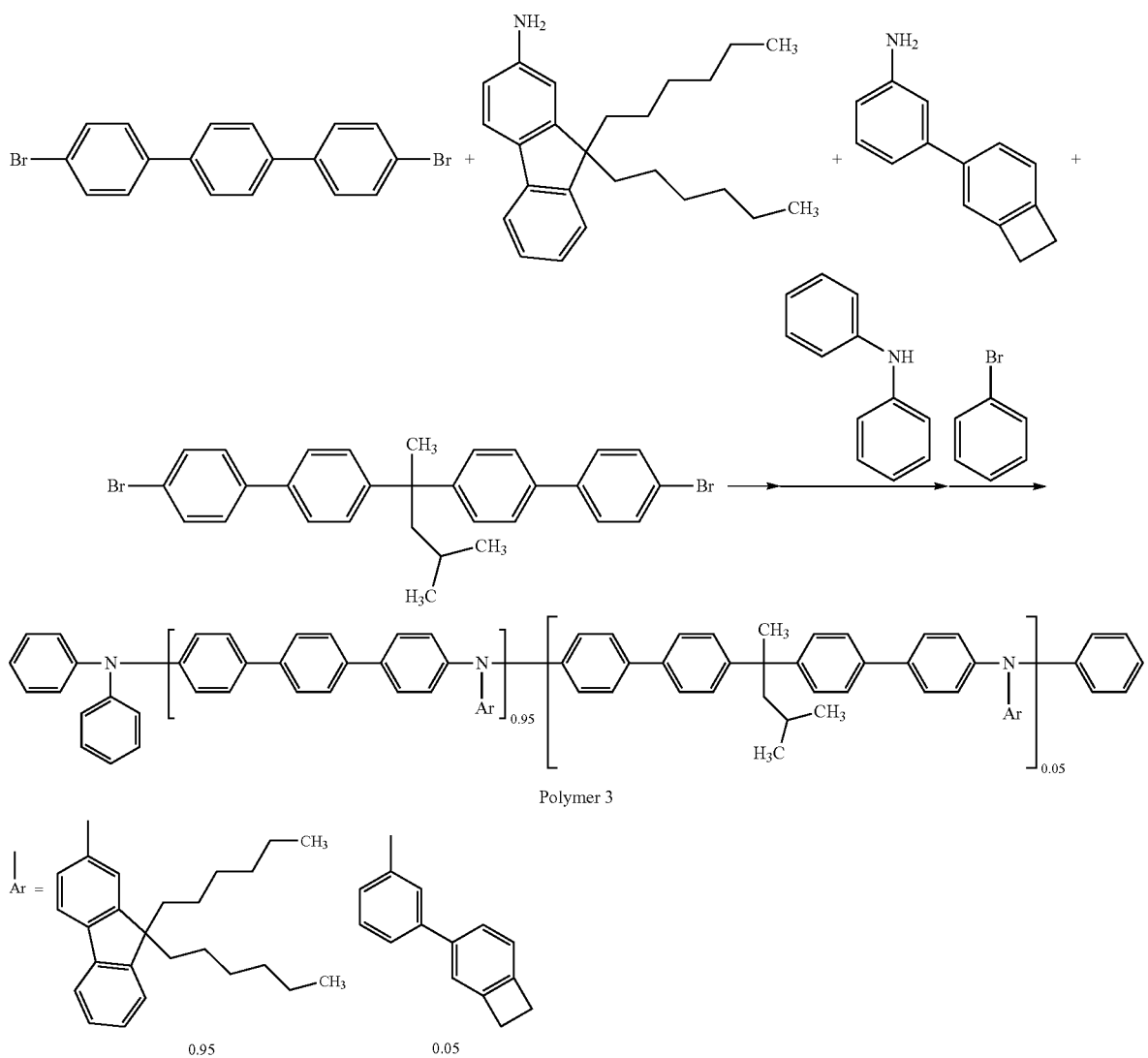

4,4"-Dibromo-p-terphenyl (15.000 g, 38.6498 mmol), 2-amino-9,9-dihexylfluorene (25.669 g, 73.4347 mmol), 4-(3-aminophenyl)benzocyclobutene (0.755 g, 3.8650 mmol), sodium tert-butoxide (28.637 g, 297.9907 mmol), and toluene (415 ml) were charged, and the system was fully purged with nitrogen and heated to 95° C. (solution A). Tri-tert-butylphosphine (2.111 g, 10.4355 mmol) was added to a 26-ml toluene solution of a tris(dibenzylideneacetone)dipalladium chloroform complex 0.800 g, 0.7730 mmol) and heated to 60° C. (solution B). In a nitrogen gas stream, the solution B was added to the solution A, followed by heating at reflux to cause a reaction for 2.0 hours. After confirming that 4,4"-dibromo-p-terphenyl, 2-amino-9,9-dihexylfluorene, and 4-(3-aminophenyl)benzocyclobutene had disappeared, 4,4"-dibromo-p-terphenyl (13.350 g, 34.3984 mmol) and 2,2-bis[4-(4-bromophenyl)phenyl]-4-methylpentane (1.907 g, 3.4785 mmol) were further added thereto. After heating at reflux for 1.0 hour, the reaction mixture was allowed to cool and then added dropwise to 4,700 ml of ethanol to crystallize a crude polymer 3.

The obtained crude polymer 3 was dissolved in 750 ml of toluene. N,N-diphenylamine (2.611 g) and sodium tert-butoxide (14.234 g) were charged, and the system was fully purged with nitrogen and heated to 95° C. (solution C). Tri-tert-butylphosphine (2.111 g, 10.4355 mmol) was added to a 26-ml toluene solution of a tris(dibenzylideneacetone)dipalladium chloroform complex (0.800 g, 0.7730 mmol) and heated to 60° C. (solution D). In a nitrogen gas stream, the solution D was added to the solution C, followed by heating at reflux to cause a reaction for 3 hours. Bromobenzene (12.112 g) was added to the reaction mixture, followed by heating at reflux to cause a reaction for 3 hours. The reaction mixture was allowed to cool and added dropwise to an ethanol (3,300 ml) solution to give an end-capped crude polymer 3.

The end-capped crude polymer 3 was dissolved in toluene, washed with dilute hydrochloric acid, and reprecipitated in ammonia-containing ethanol. The obtained polymer was dissolved in toluene and reprecipitated in acetone, and the precipitated polymer was collected by filtration. The obtained polymer was purified by column chromatography to give a polymer 3 (24.5 g).

Weight average molecular weight (Mw)=70,000
Number average molecular weight (Mn)=49,000
Dispersion (Mw/Mn)=1.43

Example 3

By the following method, an organic electroluminescent element having the following layer structure was produced: (anode/hole injection layer/hole transport layer/light-emitting layer/electron injection layer/cathode).

A glass substrate having formed thereon a 70-nm-thick, transparent, electrically conductive film of indium-tin oxide (ITO) (film formed by sputtering, sheet resistance: 15Ω) was patterned into 2-mm-wide stripes by ordinary photolithography to form an anode. The patterned ITO substrate was ultrasonically cleaned with acetone, washed with pure water, and then ultrasonically cleaned with isopropyl alcohol. The substrate was then dried by nitrogen blowing and finally subjected to UV ozone cleaning.

First, a coating liquid for forming a hole injection layer containing a polymer represented by the following formula (H1) (Mw=70,000, Mn=40,000), 4-isopropyl-4'-methyl-diphenyliodonium tetrakis(pentafluorophenyl)borate, and ethyl benzoate was prepared. The coating liquid was formed into a film on the anode by spin coating under the following conditions to give a 30-nm-thick hole injection layer. Incidentally, the polymer represented by structural formula (H1) was synthesized by the method described in WO 2009/123269.

[Chemical Formula 27]

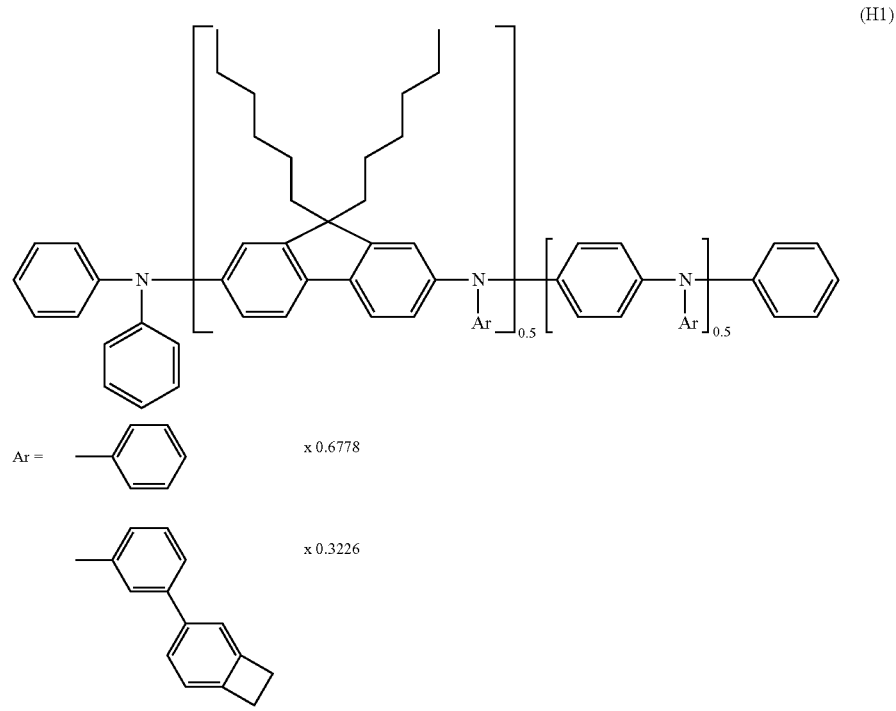

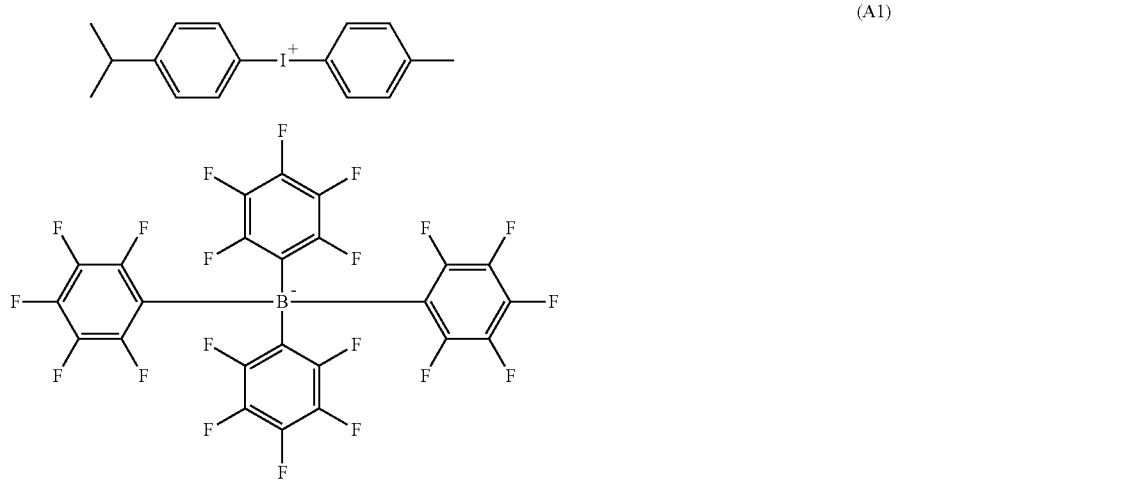

(A1)

<Coating Liquid for Forming Hole Injection Layer>

| Solvent | Ethyl benzoate |
|---|---|
| Coating liquid concentration | H1: 2.5 wt % |
| A1: 0.5 wt % | |

<Conditions for Hole Injection Layer Formation>

| Spinner rotation time | 30 seconds |
|---|---|
| Spin-coating atmosphere | In air |
| Heating conditions | 230° C., 1 hour |

Subsequently, a coating liquid for forming a hole transport layer containing the polymer synthesized in Example 2 represented by the following formula (H2) (weight average molecular weight: Mw=73,800, Mn=49,400) was prepared and formed into a film by spin coating under the following conditions to form a 15-nm-thick hole transport layer.

<Coating Liquid for Forming Hole Transport Layer>

| Solvent | Cyclohexylbenzene |
|---|---|
| Coating liquid concentration | 1.0 wt % |

<Conditions for Hole Transport Layer Formation>

| Spinner rotation time | 30 seconds |
|---|---|
| Spin coating atmosphere | In nitrogen |
| Heating conditions | 230° C., 1 hour |

Subsequently, a coating liquid for forming a light-emitting layer containing compounds represented by the following formulae (M1), (M2), and (M3) was prepared and formed into a film by spin coating under the following conditions to form a 15-nm-thick light-emitting layer.

[Chemical Formula 28]

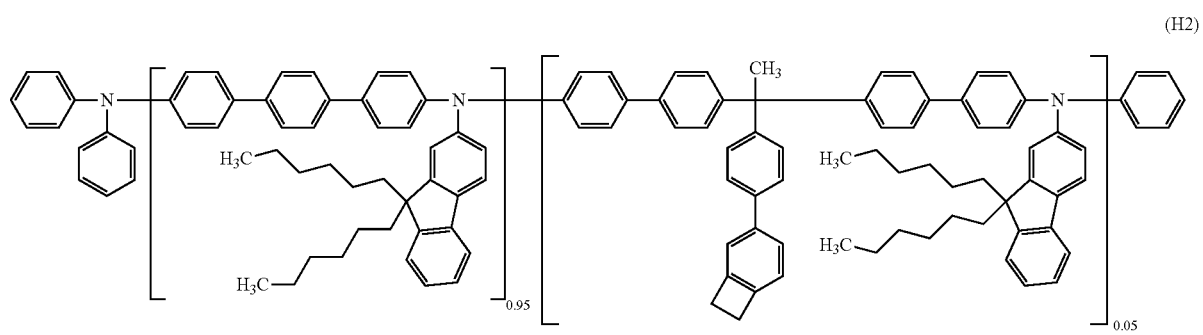

(H2)

[Chemical Formula 29]
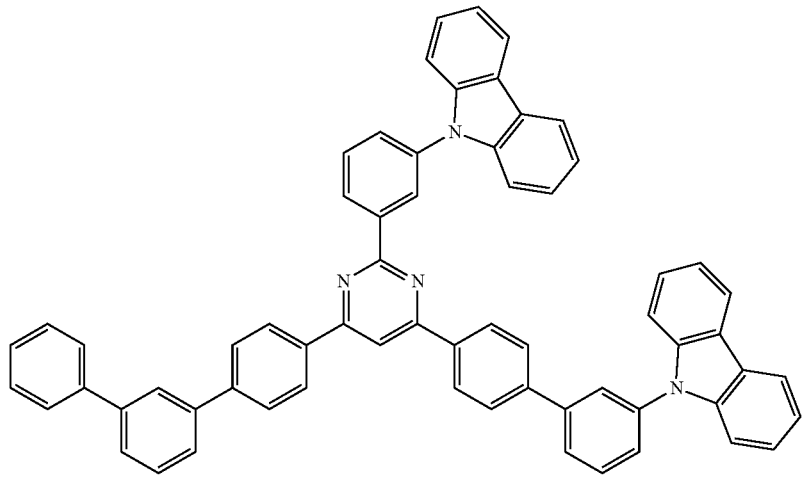
(M 1)
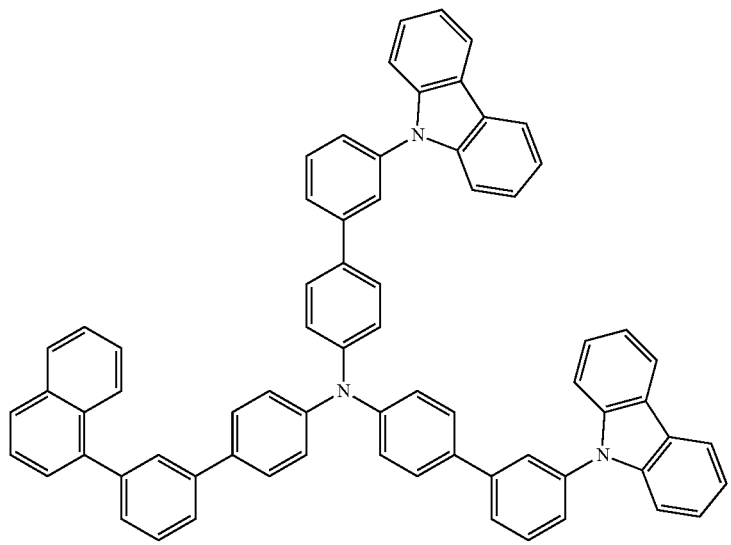
(M 2)
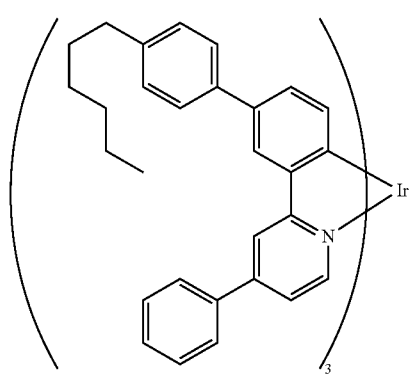
(M 3)

<Coating Liquid for Forming Hole Transport Layer>

| Solvent | Cyclohexylbenzene |
|---|---|
| Coating liquid concentration | M1: 1.2 wt % |
| M2: 3.6 wt % | |
| M3: 0.72 wt % | |

<Conditions for Hole Transport Layer Formation>

| Spinner rotation time | 30 seconds |
|---|---|
| Spin coating atmosphere | In nitrogen |
| Heating conditions | 130° C., 10 minutes |

On the obtained light-emitting layer, the following layers where successively laminated by a vacuum deposition method: a 10-nm-thick layer of a compound E1 having the following structure as a hole-blocking layer, and then a 20-nm-thick layer of a compound E2 having the following structure as an electron transport layer.

[Chemical Formula 30]

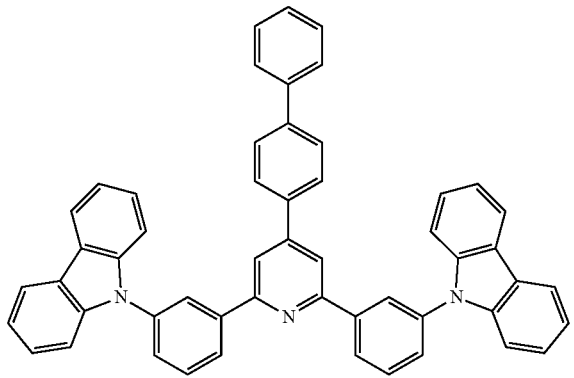

(E1)

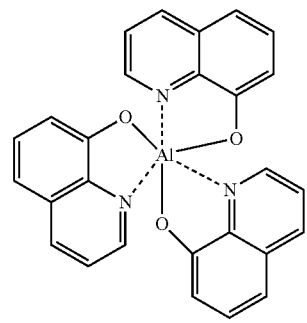

(E2)

Subsequently, by a vacuum deposition method, a 0.5-nm-thick layer of lithium fluoride (LiF) as an electron injection layer and an 80-nm-thick layer of aluminum as a cathode were each laminated in the form of 2-mm-wide stripes perpendicular to the ITO stripes, the anode. As a result, an organic electroluminescent element having a light-emitting region with a size of 2 mm×2 mm was obtained.

It was confirmed that this element emits yellow light with an EL peak wavelength of 564 nm derived from M3. When a voltage of 8 V was applied to this element, the current density was 15.7 mA/cm$^2$, and the luminance was 7,030 cd/m$^2$. By using the polymer of the invention in a hole transport layer, a element having a high current density at a constant voltage (i.e., the driving voltage is low) and high luminance was obtained. Table 1 shows the characteristics of the organic electroluminescent elements obtained in Example 3 and the below-mentioned Comparative Example 2.

TABLE 1

| | Current Density [mA/cm$^2$] | Luminance [cd/cm$^2$] |
|---|---|---|
| Example 3 | 15.7 | 7,030 |
| Comparative Example 2 | 15.0 | 6,710 |

Comparative Example 2

An organic electroluminescent element was produced in the same manner as in Example 3, except that the hole transport layer was formed as follows.

A coating liquid for forming a hole transport layer containing the polymer synthesized in Comparative Example 1 represented by the following formula (H3) (weight average molecular weight: Mw=70,000, Mn=49,000) was prepared and formed into a film by spin coating under the following conditions to form a 15-nm-thick hole transport layer.

<Coating Liquid for Forming Hole Transport Layer>

| Solvent | Cyclohexylbenzene |
|---|---|
| Coating liquid concentration | 1.0 wt % |

<Conditions for Hole Transport Layer Formation>

| Spinner rotation time | 30 seconds |
|---|---|
| Spin coating atmosphere | In nitrogen |
| Heating conditions | 230° C., 1 hour |

[Chemical Formula 31]

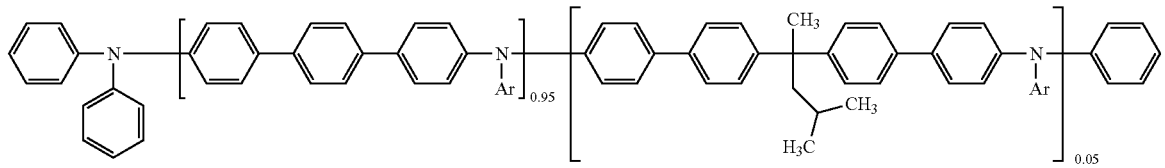

(H3)

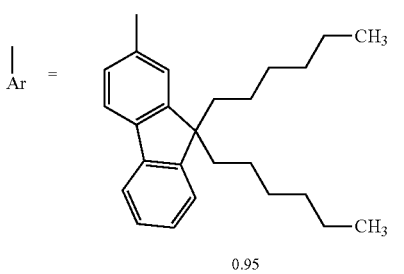
0.95

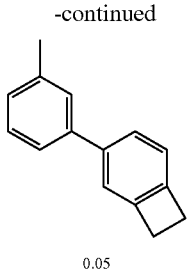
0.05

It was confirmed that this element emits yellow light with an EL peak wavelength of 564 nm derived from M3. When a voltage of 8 V was applied to this element, the current density was 15.0 mA/cm$^2$, and the luminance was 6,710 cd/m$^2$.

The invention has been described in detail with reference to specific embodiments. However, it will be apparent to those skilled in the art that various changes and modifications can be made without departing from the spirit and scope of the invention. This application is based on Japanese Patent Application No. 2012-136946 filed on Jun. 18, 2012, the contents of which are incorporated herein by reference.

The invention claimed is:

1. A polymer compound comprising a group represented by the following formula (1) as a side chain connecting to a carbon atom:

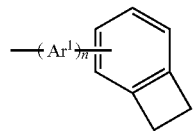

(1)

wherein
the carbon atom to which the group represented by formula (1) connects is a carbon atom that is the center of sp$^3$ hybrid orbitals which is not a part of a cyclic structure, wherein
the benzocyclobutene ring is optionally substituted, and the substituents may connect to each other to form a ring,
Ar$^1$ represents an optionally substituted aromatic hydrocarbon group or an optionally substituted aromatic heterocyclic group,
n represents an integer of 1 to 6, and
n Ar$^1$s may be the same or different.

2. The polymer compound according to claim 1, comprising a nitrogen atom that is the center of sp$^3$ hybrid orbitals in the main chain.

3. The polymer compound according to claim 1, comprising a monovalent, or divalent or higher group derived from a fluorene ring as a substructure.

4. The polymer compound according to claim 1, having a weight average molecular weight (Mw) of 20,000 or more and a dispersion (Mw/Mn) of 2.5 or less, wherein Mn represents a number average molecular weight.

5. The polymer compound according to claim 4, having a weight average molecular weight (Mw) of 60,000 or more and a dispersion (Mw/Mn) of 2.0 or less.

6. The polymer compound according to claim 1, comprising a repeating unit represented by formula (2):

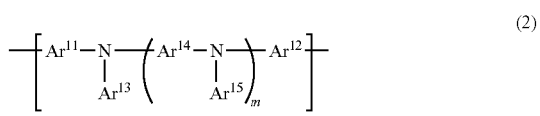

(2)

wherein
m represents an integer of 0 to 3,
Ar$^{11}$ and Ar$^{12}$ each independently represent a direct bond, an optionally substituted aromatic hydrocarbon group, or an optionally substituted aromatic heterocyclic group,
Ar$^{13}$ to Ar$^{15}$ each independently represent an optionally substituted aromatic hydrocarbon group or an optionally substituted aromatic heterocyclic group, and
m Ar$^{14}$s or m Ar$^{15}$s may each be the same or different, with the proviso that Ar$^{11}$ and Ar$^{12}$ are not direct bonds at the same time.

7. The polymer compound according to claim 1, comprising a repeating unit represented by formula (3):

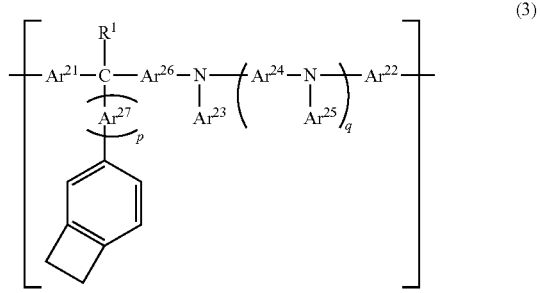

(3)

wherein
p represents an integer of 1 to 6, q represents an integer of 0 to 3,
Ar$^{21}$ and Ar$^{22}$ each independently represent a direct bond, an optionally substituted aromatic hydrocarbon group, or an optionally substituted aromatic heterocyclic group,
Ar$^{23}$ to Ar$^{27}$ each independently represent an optionally substituted aromatic hydrocarbon group or an optionally substituted aromatic heterocyclic group,
R$^1$ represents a hydrogen atom, an optionally substituted alkyl group having 1 to 24 carbon atoms, an optionally substituted alkoxy group having 1 to 24 carbon atoms, an optionally substituted aromatic hydrocarbon group, or an optionally substituted aromatic heterocyclic group,
p Ar$^{27}$s may be the same or different, and
q Ar$^{24}$s or q Ar$^{25}$s may each be the same or different, with the proviso that $Ar^{21}$ and $Ar^{22}$ are not direct bonds at the same time.

8. The polymer compound according to claim 1, wherein the number of groups represented by formula (1) is 0.01 or more and 3 or less per 1,000 of the molecular weight.

9. A charge-transporting polymer comprising the polymer compound of claim 1, the polymer compound having charge-transporting properties.

10. A composition, comprising the charge-transporting polymer of claim 9.

11. An organic electroluminescent element comprising, on a substrate, an anode, a cathode, and an organic layer between the anode and the cathode,
the organic layer comprising a layer formed by a wet film-forming method employing the composition for an organic electroluminescent element of claim 10.

12. The organic electroluminescent element according to claim 11, wherein the layer formed by a wet film-forming method is at least one of an hole injection layer and a hole transport layer.

13. The organic electroluminescent element according to claim 11, comprising an hole injection layer, a hole transport layer, and a light-emitting layer between the anode and the cathode,
the hole injection layer, the hole transport layer, and the light-emitting layer all being formed by a wet film-forming method.

14. An organic EL display device comprising the organic electroluminescent element of claim 11.

15. An organic EL light comprising the organic electroluminescent element of claim 11.

* * * * *